US012796200B2

(12) United States Patent
Song et al.

(10) Patent No.: US 12,796,200 B2
(45) Date of Patent: Nov. 10, 2026

(54) DISPLAY DEVICE COMPRISING SEMICONDUCTOR LIGHT-EMITTING ELEMENT

(71) Applicants: LG ELECTRONICS INC., Seoul (KR); LG DISPLAY CO., LTD., Seoul (KR)

(72) Inventors: Hooyoung Song, Seoul (KR); Jungmin Kim, Paju-si (KR); Eunhye Lee, Paju-si (KR); Gisang Hong, Paju-si (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 382 days.

(21) Appl. No.: 18/575,361

(22) PCT Filed: Jun. 24, 2022

(86) PCT No.: PCT/KR2022/009066
§ 371 (c)(1),
(2) Date: Dec. 29, 2023

(87) PCT Pub. No.: WO2023/277466
PCT Pub. Date: Jan. 5, 2023

(65) Prior Publication Data

US 2024/0304774 A1    Sep. 12, 2024

(30) Foreign Application Priority Data

Jun. 30, 2021 (KR) ........................ 10-2021-0085627

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ...... H10H 20/857; H10H 29/03; H10H 29/37; H10H 29/30; H10H 29/49; H10H 29/142;
(Continued)

(56) References Cited

U.S. PATENT DOCUMENTS

2011/0127537 A1* 6/2011 Matsumuro ............ H10D 86/60
438/34
2017/0133550 A1 5/2017 Schuele et al.
(Continued)

FOREIGN PATENT DOCUMENTS

KR 10-1987196 B1 6/2019
KR 10-2019-0075869 A 7/2019
(Continued)

OTHER PUBLICATIONS

International Search Report (PCT/ISA/210) issued in PCT/KR2022/009066, dated Oct. 17, 2022.

*Primary Examiner* — Bitew A Dinke
(74) *Attorney, Agent, or Firm* — Birch, Stewart, Kolasch & Birch, LLP

(57) ABSTRACT

The display device according to the embodiment includes a substrate; a first assembly wiring and second assembly wiring alternately arranged on the substrate and spaced apart from each other; a first insulating layer disposed between the first assembly wiring and the second assembly wiring and having different first and second thicknesses; a planarization layer disposed on the first assembly wiring and the second assembly wiring and having a first opening; and a light emitting device disposed inside the first opening, wherein a first electrode overlaps the first assembly wiring and the second assembly wiring, wherein the first electrode is con-
(Continued)

figured to be electrically connected to either the first assembly wiring or the second assembly wiring.

18 Claims, 13 Drawing Sheets

(58) Field of Classification Search
CPC ... H10W 90/00; H10D 86/441; H10D 86/451; H10D 86/60; H10D 86/00
See application file for complete search history.

(56) References Cited

U.S. PATENT DOCUMENTS

| | | | | |
|---|---|---|---|---|
| 2017/0358563 | A1* | 12/2017 | Cho | H10H 20/819 |
| 2018/0083218 | A1* | 3/2018 | Choi | H10K 59/878 |
| 2018/0190672 | A1 | 7/2018 | Lee et al. | |
| 2019/0302917 | A1* | 10/2019 | Pan | G06F 3/044 |
| 2020/0168662 | A1* | 5/2020 | Kim | H10H 29/142 |
| 2020/0212267 | A1* | 7/2020 | Kwak | H10H 20/819 |
| 2021/0272937 | A1* | 9/2021 | Lim | H10H 20/857 |
| 2021/0391496 | A1* | 12/2021 | Cho | H10H 20/0137 |
| 2022/0005979 | A1* | 1/2022 | Kang | H10H 20/8316 |
| 2022/0029058 | A1* | 1/2022 | Kim | H10H 20/8312 |
| 2022/0052034 | A1* | 2/2022 | Chi | H10W 90/00 |
| 2022/0131027 | A1* | 4/2022 | Akimoto | H10H 20/018 |
| 2022/0262782 | A1* | 8/2022 | Akimoto | H10H 29/142 |
| 2022/0351993 | A1 | 11/2022 | Jeong et al. | |
| 2023/0059135 | A1 | 2/2023 | Chang et al. | |
| 2023/0110862 | A1 | 4/2023 | Kim et al. | |
| 2023/0130868 | A1* | 4/2023 | Yang | H10H 20/01 257/89 |
| 2024/0186472 | A1* | 6/2024 | Yoon | H10D 86/00 |
| 2024/0347548 | A1* | 10/2024 | Bang | H10D 86/60 |
| 2025/0015243 | A1* | 1/2025 | Bang | H10H 20/857 |
| 2025/0048815 | A1* | 2/2025 | Kim | H10H 20/857 |
| 2025/0054923 | A1* | 2/2025 | Kim | H10D 86/00 |
| 2025/0072185 | A1* | 2/2025 | Kim | H10D 86/00 |

FOREIGN PATENT DOCUMENTS

| | | | |
|---|---|---|---|
| KR | 10-2019-0143840 | A | 12/2019 |
| KR | 10-2020-0006651 | A | 1/2020 |
| KR | 10-2020-0026845 | A | 3/2020 |
| KR | 10-2173349 | B1 | 11/2020 |
| WO | WO 2020/262752 | A1 | 12/2020 |

* cited by examiner

【FIG. 1】
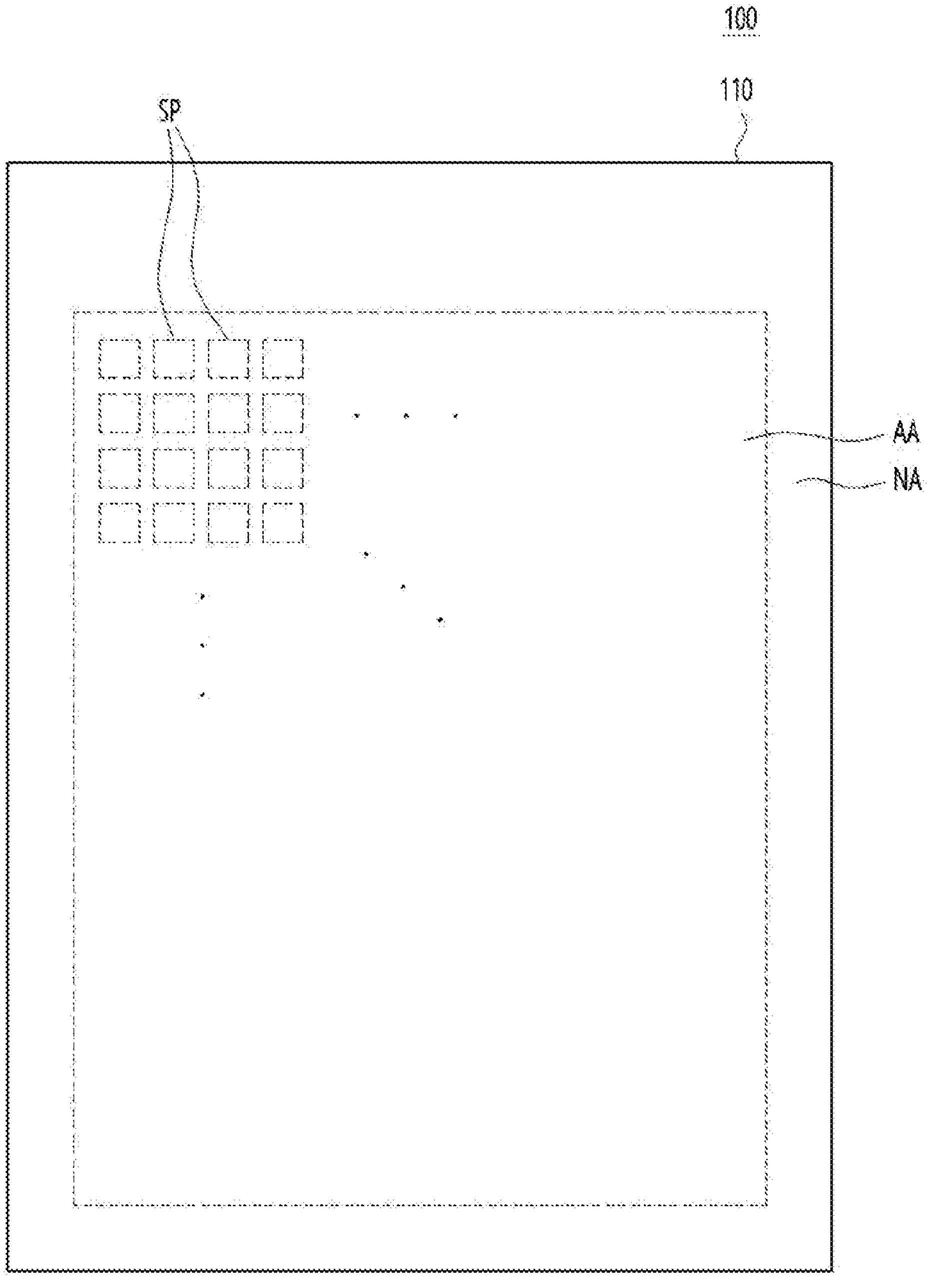

【FIG. 2】
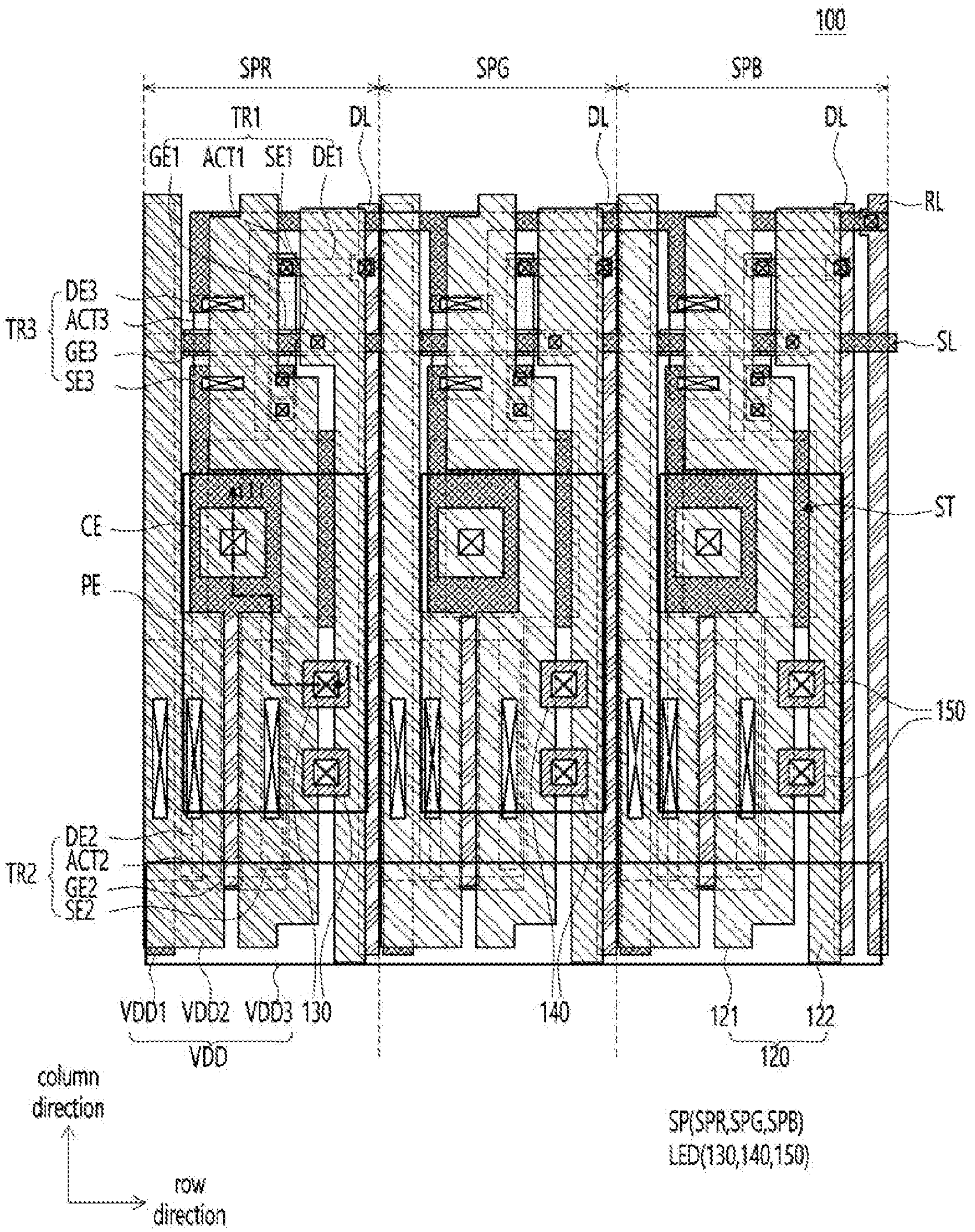

【FIG. 3】
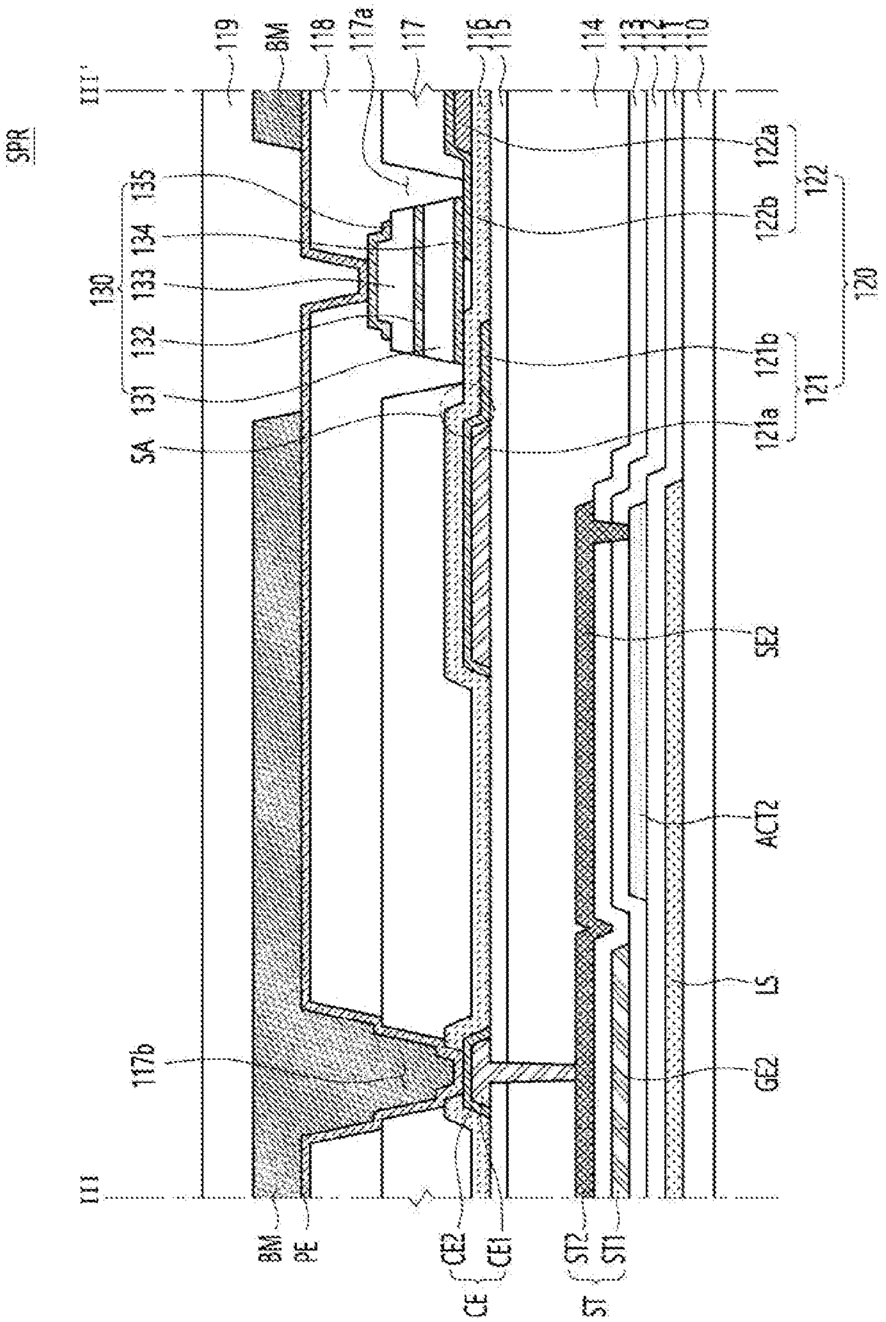

【FIG. 4a】
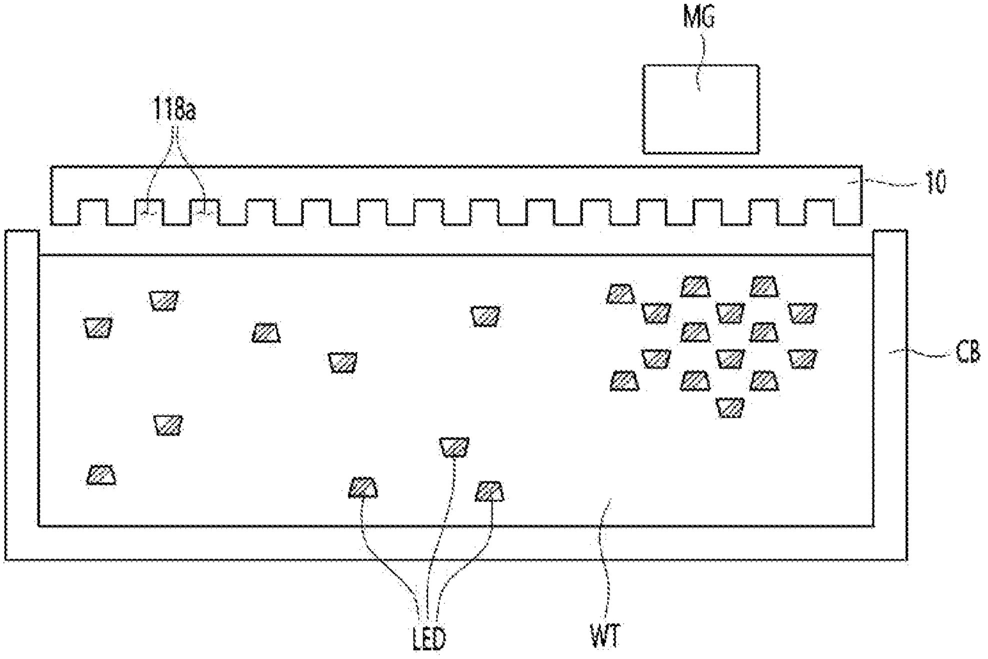

【FIG. 4b】
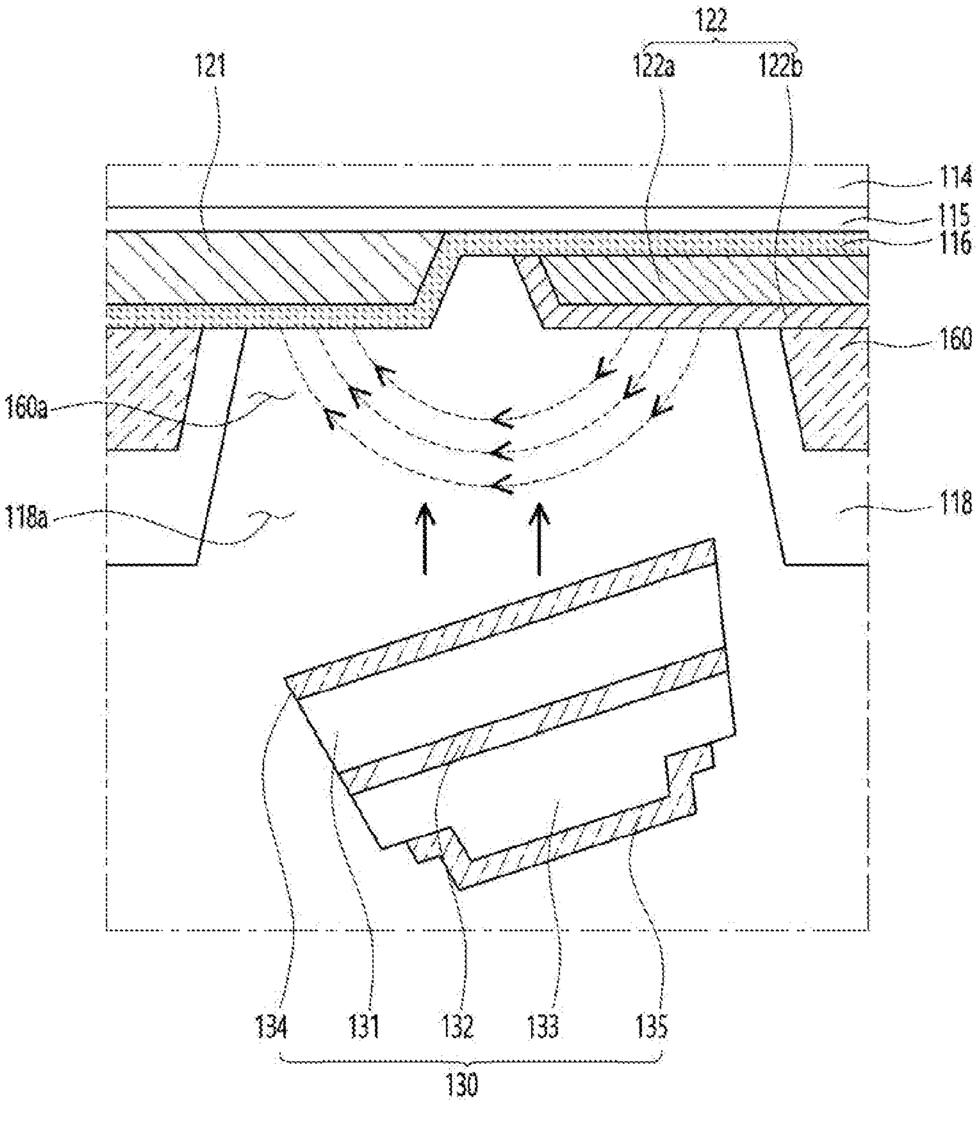

【FIG. 5】
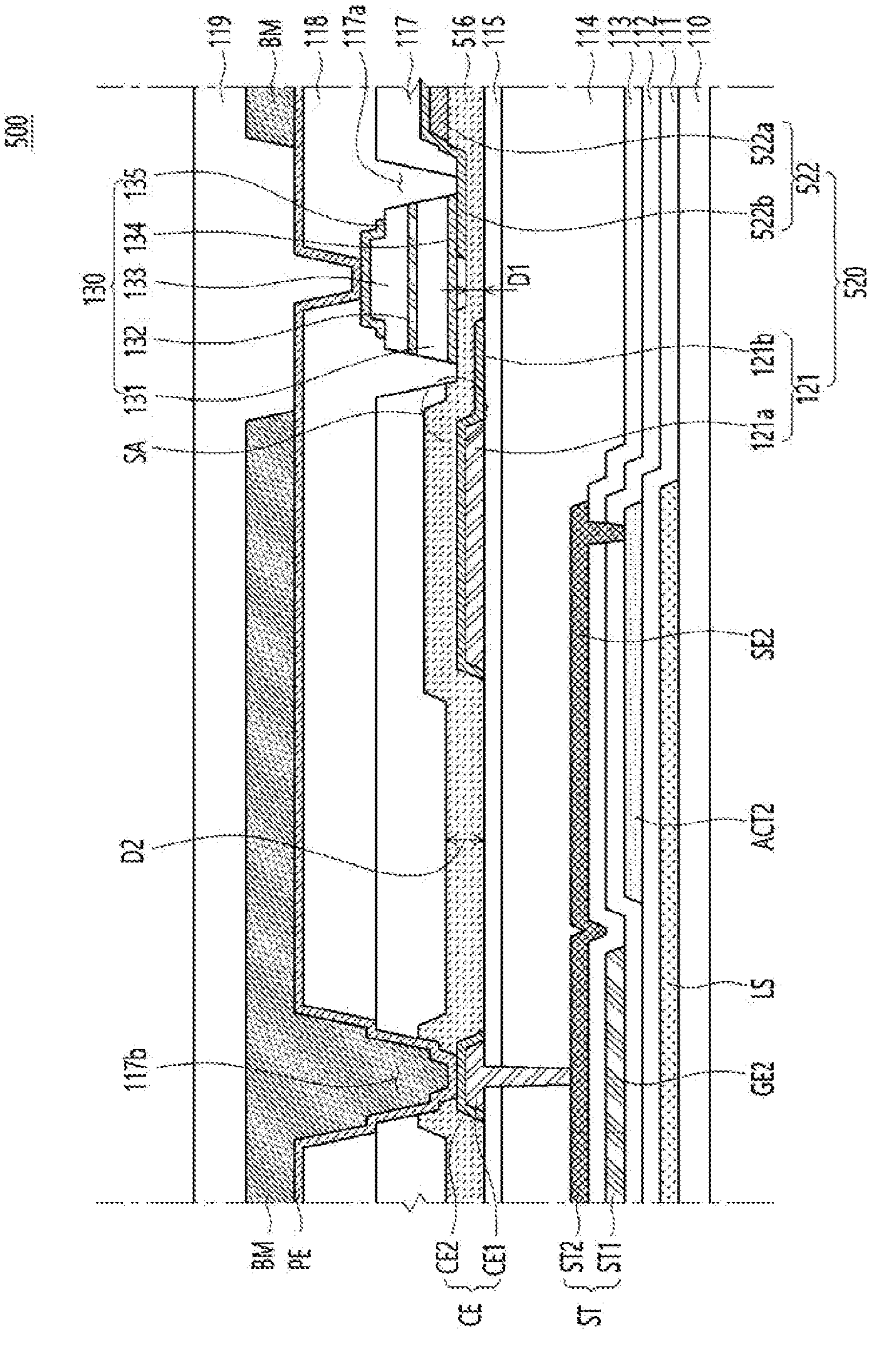

【FIG. 6】
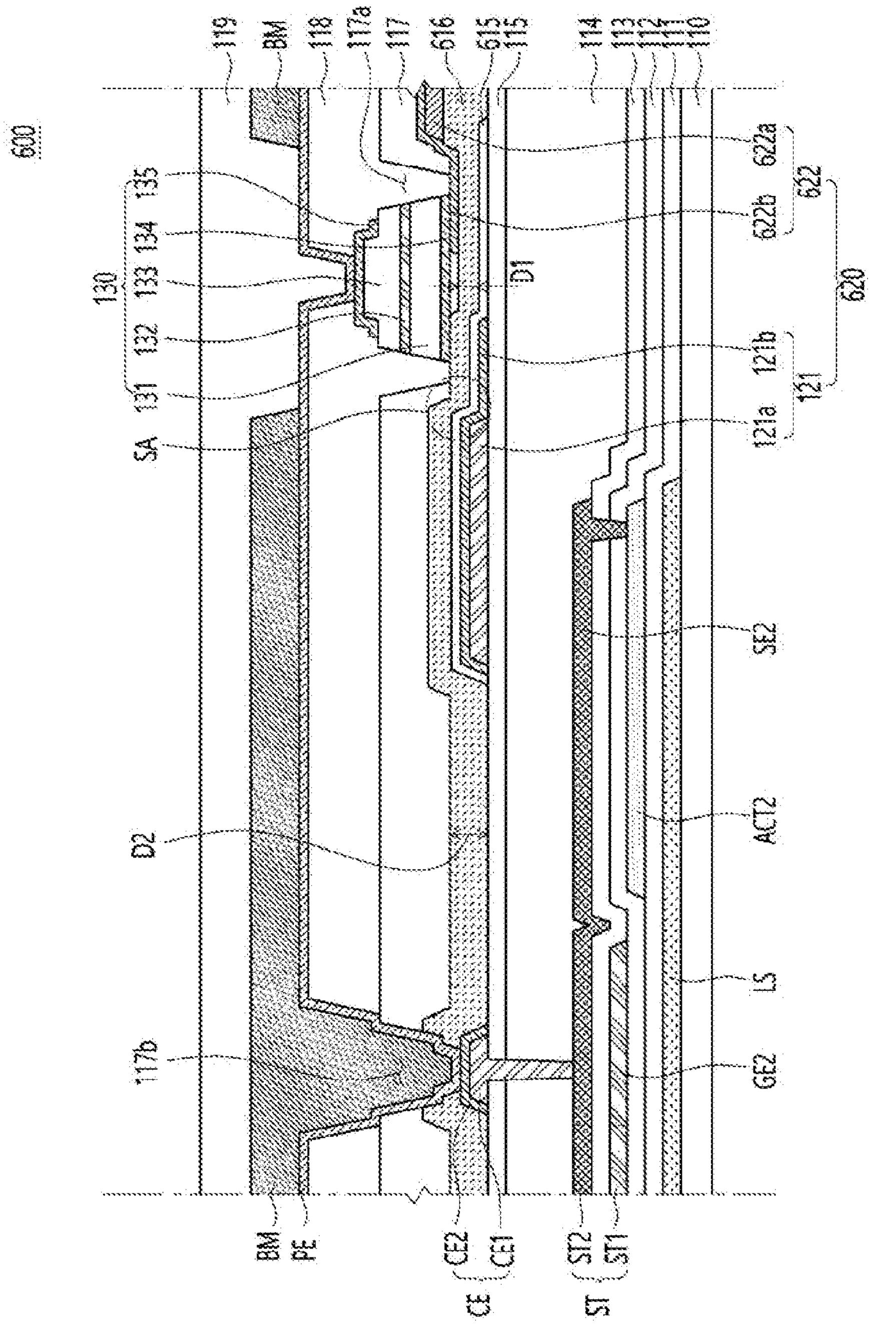

【FIG. 7】
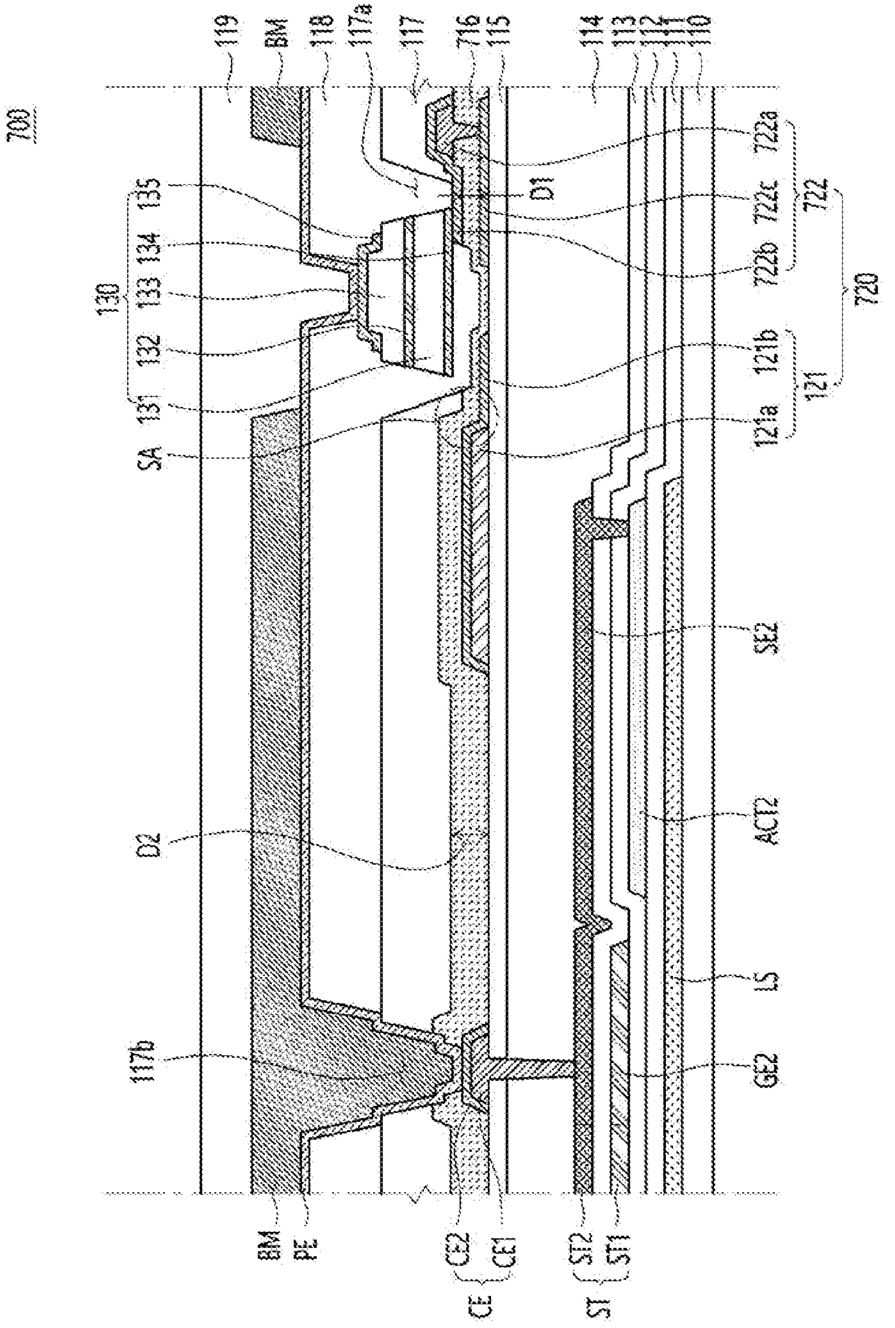

【FIG. 8】
800
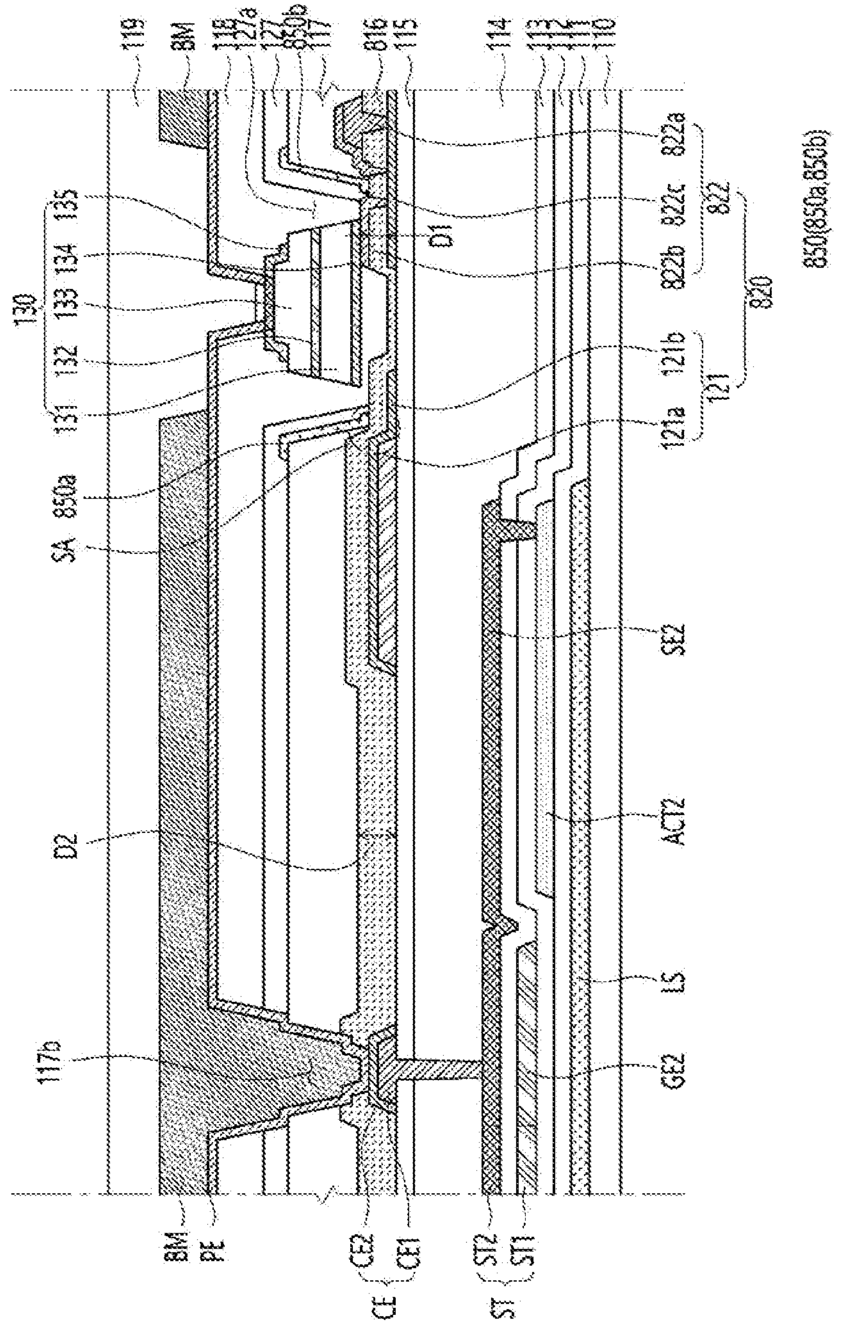

【FIG. 9】
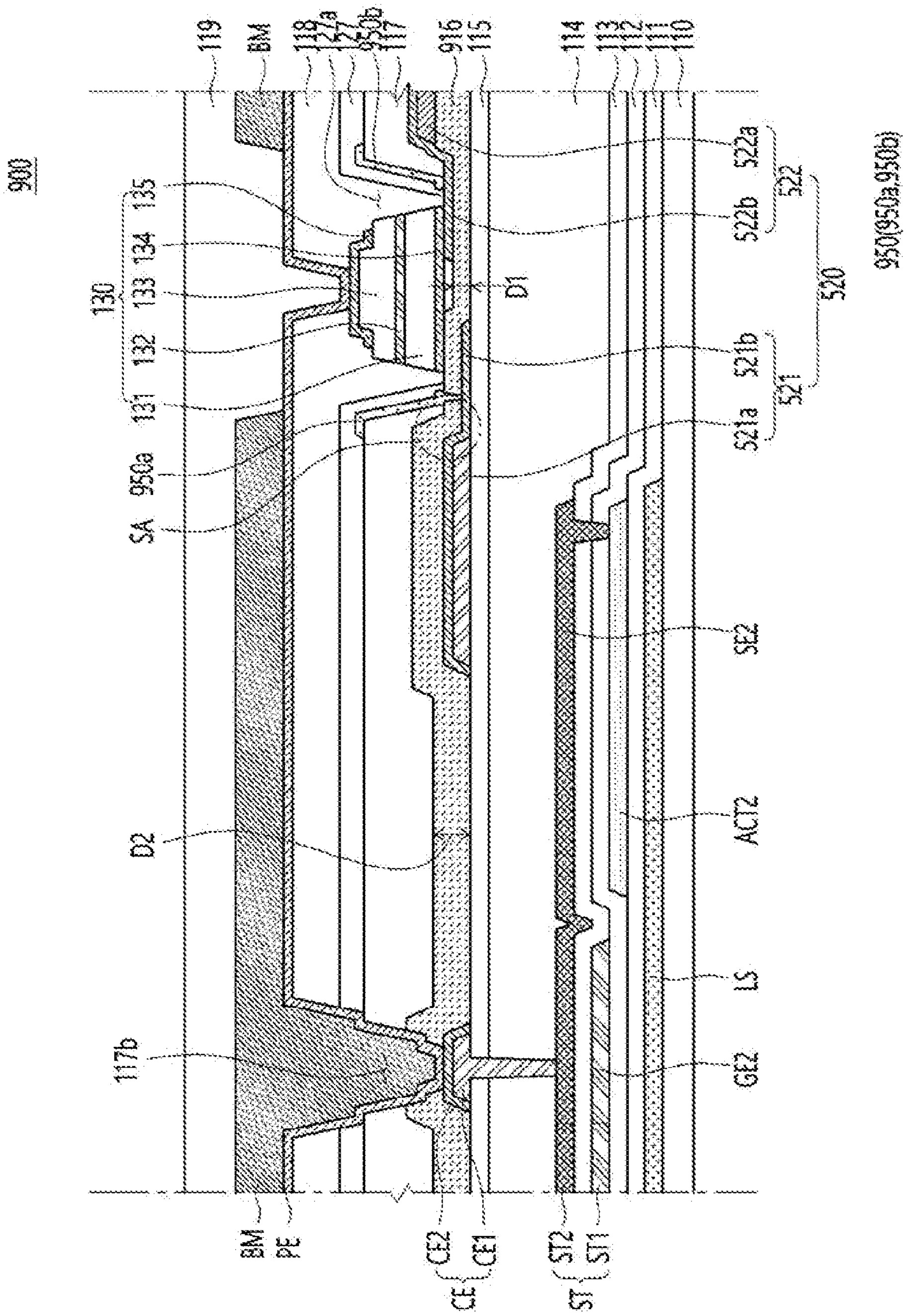

【FIG. 10】
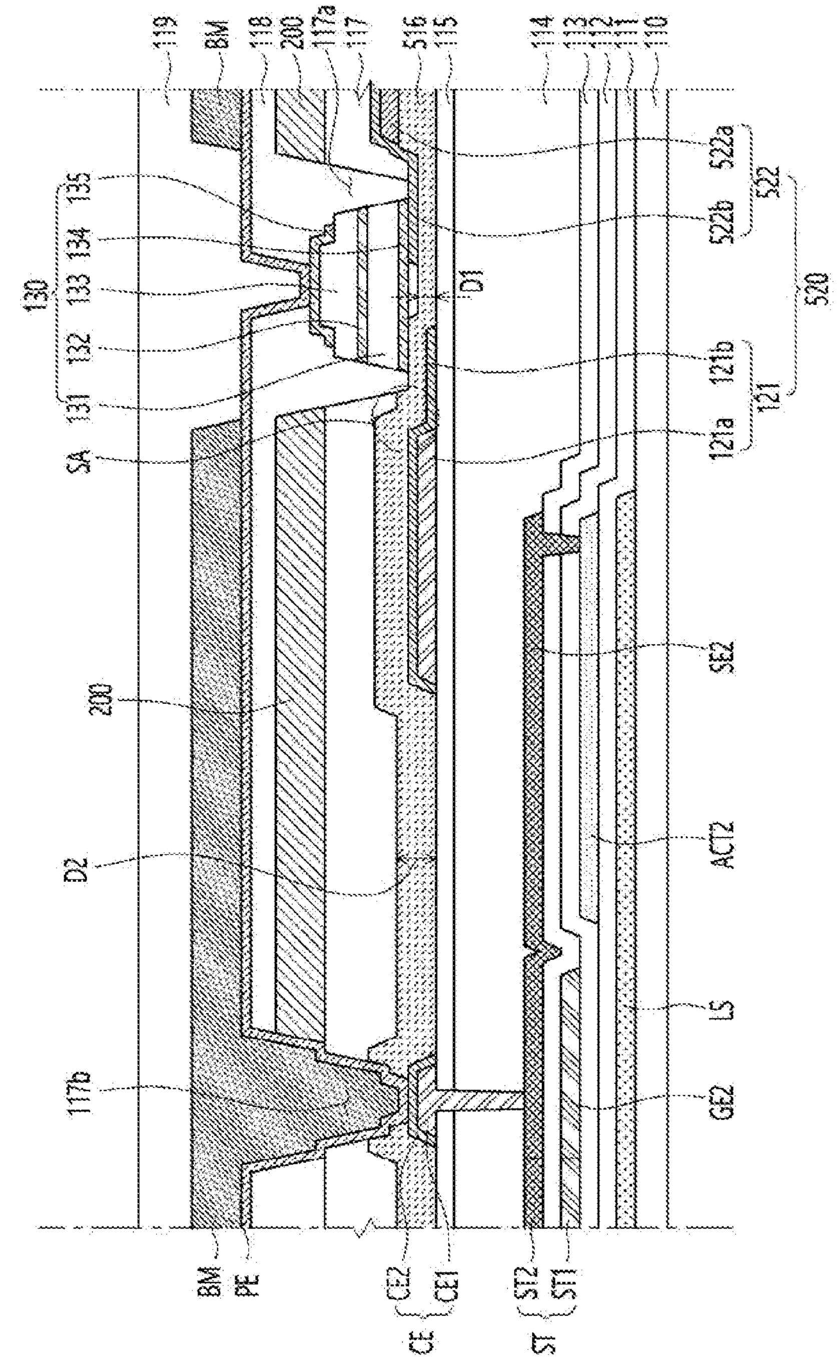

【FIG. 11】
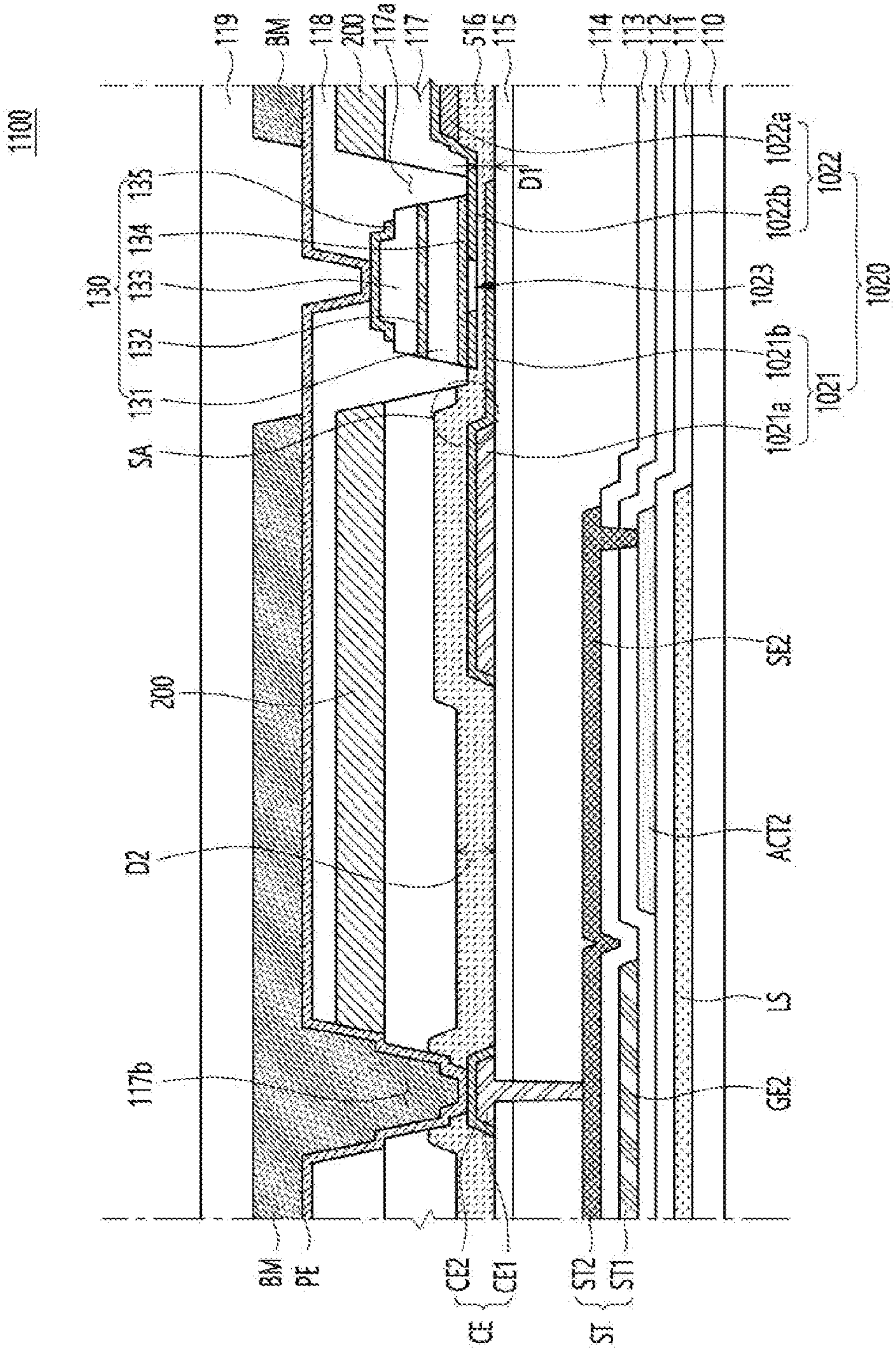

【FIG. 12】
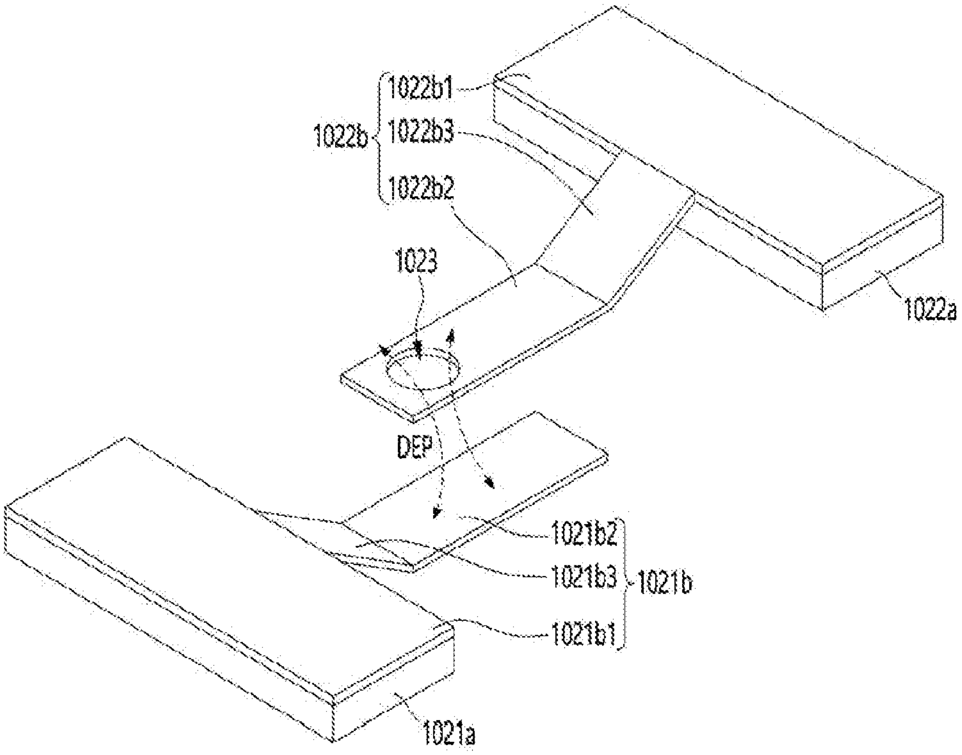

DISPLAY DEVICE COMPRISING SEMICONDUCTOR LIGHT-EMITTING ELEMENT

CROSS REFERENCE TO RELATED APPLICATIONS

This application is the National Phase of PCT International Application No. PCT/KR2022/009066, filed on Jun. 24, 2022, which claims priority under 35 U.S.C. 119 (a) to Patent Application No. 10-2021-0085627, filed in the Republic of Korea on Jun. 30, 2021, all of which are hereby expressly incorporated by reference into the present application.

TECHNICAL FIELD

The embodiment relates to a display device, and more specifically, to a display device using a semiconductor light emitting device.

BACKGROUND ART

There are organic light emitting displays (OLED) that emit light on their own, liquid crystal displays (LCD) and micro-LED displays that require a separate light source in the display devices used in computer monitors, TVs, mobile phones, etc.

Micro-LED display is a display that uses micro-LED, a semiconductor light emitting device with a diameter or cross-sectional area of 100 μm or less, as a display element.

Micro-LED displays use micro-LED, a semiconductor light emitting device, as a display device, so they have excellent performance in many characteristics such as contrast ratio, response speed, color gamut, viewing angle, brightness, resolution, lifespan, luminous efficiency, and luminance.

In particular, the micro-LED display has the advantage of being able to freely adjust the size and resolution and implement a flexible display because the screen may be separated and combined in a modular manner.

However, because large micro-LED displays require more than millions of micro-LEDs, there is a technical problem that makes it difficult to quickly and accurately transfer micro-LEDs to the display panel. Meanwhile, methods for transferring a semiconductor light emitting device to a substrate include a pick and place process, a laser lift-off method, or a self-assembly method.

Among these, the self-assembly method is a method in which the semiconductor light emitting device finds its assembly position within the fluid on its own, and is an advantageous method for implementing a large-screen display device.

Meanwhile, when transferring a light emitting device in a fluid, a problem arises where the assembly wiring is corroded by the fluid. Corrosion of the assembly wiring may cause an electrical short circuit and cause assembly defects.

Additionally, during self-assembly, a new light emitting device may collide with the assembled light emitting device due to force generated in the assembly hole, causing damage to the light emitting device.

DISCLOSURE

Technical Problem

The technical object of the embodiment is to provide a display device that improves the assembly rate of light emitting devices by implementing assembly wiring in various forms.

Additionally, the technical object of the embodiment is to provide a display device that minimizes corrosion of assembly wiring.

Additionally, the technical object of the embodiment is to provide a display device with precisely controlled spacing between assembly wirings.

The objects of the embodiment are not limited to the objects mentioned above and include what may be understood from the specification.

Technical Solution

A display device including a semiconductor light emitting device according to an embodiment may include a substrate, first and second assembly wirings arranged alternately on the substrate and spaced apart from each other, a first insulating layer disposed between the first assembly wiring and the second assembly wiring and having different first and second thicknesses, a planarization layer disposed on the first assembly wiring and the second assembly wiring and having a first opening and a light emitting device disposed inside the first opening, wherein a first electrode overlaps the first assembly wiring and the second assembly wiring.

The first electrode may be electrically connected to one of the first assembly wiring and the second assembly wiring.

In an embodiment, the first thickness is the thickness of the first insulating layer in the area within the first opening, and the second thickness is the thickness of the first insulating layer in the area outside the first opening, the second thickness may be thicker than the first thickness.

The first thickness is the thickness of the first insulating layer in the area within the first opening, and the second thickness is the thickness of the first insulating layer in the area outside the first opening, the second thickness may be thicker than the first thickness.

In addition, in the embodiment, the first conductive layer and the second conductive layer overlap the planarization layer, and a portion of each of the first clad layer and the second clad layer may be disposed inside the first opening.

The second clad layer may cover the first conductive layer on the first conductive layer.

The embodiment further including a third clad layer disposed on the same plane as the first clad layer below the first insulating layer, and the third clad layer may be connected to the second conductive layer through a contact hole included in the first insulating layer.

It may further include a second insulating layer covering the first clad layer on the first clad layer.

It may further include a reflective layer disposed on a side of the planarization layer in the first opening.

The embodiment may further include a third insulating layer disposed on the planarization layer.

The first assembly wiring may vertically overlap the second assembly wiring, and the second assembly wiring may include an electrode hole in an area that vertically overlaps the first assembly wiring.

In addition, a display device including a semiconductor light emitting device according to an embodiment may include a substrate on which a plurality of sub-pixels are defined, a first assembly line arranged along the plurality of sub-pixels arranged on the same line among the plurality of sub-pixels, a second assembly line disposed along a plurality of sub-pixels arranged on the same line among the plurality of sub-pixels and disposed adjacent to each of the first assembly lines, a planarization layer including a first opening overlapping the first assembly wiring and the second assembly wiring, and a first insulating layer having a plurality of thicknesses on the first assembly wiring and a light emitting device disposed in the first opening in each of the plurality of sub-pixels and electrically connected to the second assembly wiring.

In an embodiment, the first insulating layer has a first thickness in an area that overlaps the first opening and a second thickness in an area that does not overlap the first opening, and the second thickness may be thicker than the first thickness.

The second assembly wiring may be disposed on the first insulating layer.

The first assembly wiring may include a first conductive layer and a first clad layer electrically connected to the first conductive layer, the second assembly wiring may include a second conductive layer and a second clad layer electrically connected to the second conductive layer, and the first conductive layer and the first clad layer may be made of different materials, and the second conductive layer and the second clad layer may be made of different materials.

Both the first clad layer and the second clad layer may extend inside the second opening.

Due to the thickness of the first conductive layer, the first conductive layer and the first clad layer include a step area, and the embodiment may further include a second insulating layer disposed on the first assembly wiring and overlapping the step area.

The second insulating layer may be disposed in the first opening.

The second insulating layer may overlap the first assembly wiring.

The embodiment may further include a third insulating layer disposed on the planarization layer.

The first assembly wiring may vertically overlap the second assembly wiring, and the second assembly wiring may include an electrode hole in an area that vertically overlaps the first assembly wiring.

Advantageous Effects

According to the embodiment, there is a technical effect of preventing the insulating properties of the insulating layer from being destroyed by increasing the thickness of the insulating layer disposed between the first assembly wiring and the second assembly wiring. Additionally, by reducing the thickness of the insulating layer disposed on the first assembly wiring, there is a technical effect of facilitating self-assembly of the light emitting device through a plurality of assembly wiring.

Additionally, the embodiment has the technical effect of reducing corrosion and short circuit defects in a plurality of assembly wiring.

For example, corrosion and short circuit defects may be reduced by placing an insulating layer on the step area of a plurality of assembly wiring. Additionally, corrosion of the conductive layer may be prevented by using a clad layer that is resistant to corrosion.

In addition, the embodiment has the technical effect of stably bonding a plurality of light emitting devices by reducing the step between the plurality of assembly wirings.

In addition, the embodiment has the technical effect of strengthening the assembly force of the light emitting device by arranging a plurality of assembly wirings in a vertically symmetrical structure.

In addition, the embodiment has the technical effect of solving the problem of tilting of the light emitting device by supporting the light emitting device with one assembly wiring.

In addition, the embodiment has the technical effect of improving assembly efficiency and protecting the assembled light emitting device by forming a thick insulating layer in areas other than the assembly hole.

The effects according to the embodiment are not limited to the contents exemplified above, and more diverse effects are included in the specification.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view taken along line III-III' of FIG. 2.

FIGS. 4A and 4B are process diagrams for explaining a manufacturing method of a display device according to an embodiment.

FIG. 5 is a cross-sectional view of a display device according to a second embodiment.

FIG. 6 is a cross-sectional view of a display device according to a third embodiment.

FIG. 7 is a cross-sectional view of a display device according to a fourth embodiment.

FIG. 8 is a cross-sectional view of a display device according to the fifth embodiment.

FIG. 9 is a cross-sectional view of a display device according to the sixth embodiment.

FIG. 10 is a cross-sectional view of a display device according to the sixth embodiment.

FIG. 11 is a cross-sectional view of a display device according to the seventh embodiment.

FIG. 12 is an enlarged perspective view of part of the seventh embodiment.

MODE FOR INVENTION

Hereinafter, embodiments disclosed in this specification will be described in detail with reference to the attached drawings. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, area or substrate is referred to as being 'on' another component, this includes either directly on the other element or there may be other intermediate elements in between.

Display devices described in this specification include digital TVs, mobile phones, smart phones, laptop computers, digital broadcasting terminals, personal digital assistants (PDAs), portable multimedia players (PMPs), navigation, and slates PCs, tablet PCs, ultra-books, desktop computers, etc. However, the features according to the embodiment described in this specification may be applied to a device capable of displaying even if it is a new product type that is developed in the future.

Hereinafter, embodiments will be described with reference to the drawings.

FIG. 1 is a schematic plan view of a display device according to an embodiment. For convenience of explanation, only the substrate 110 and the plurality of sub-pixels (SP) among the various components of the display device 100 are shown in FIG. 1.

The display device 100 according to an embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

The substrate 110 is configured to support various components included in the display device 100 and may be made of an insulating material. For example, the substrate 110 may be made of glass or resin. Additionally, the substrate 110 may include polymer or plastic, or may be made of a material with flexibility.

The substrate 110 includes a display area (AA) and a non-display area (NA).

The display area AA is an area where a plurality of sub-pixels SP are arranged and an image is displayed. Each of the plurality of sub-pixels (SP) is an individual unit that emits light, and a semiconductor light emitting device (LED) and a driving circuit are formed in each of the plurality of sub-pixels (SP). For example, the plurality of sub-pixels SP may include, but are not limited to, a red sub-pixel, a green sub-pixel, a blue sub-pixel, and/or a white sub-pixel. Hereinafter, the description will be made on the assumption that the plurality of sub-pixels SP includes a red sub-pixel, a green sub-pixel, and a blue sub-pixel, but is not limited thereto.

The non-display area (NA) is an area where images are not displayed, and is an area where various wiring, driver ICs, etc. for driving the sub-pixels (SP) arranged in the display area (AA) are placed. For example, various ICs such as gate driver ICs and data driver ICs and driving circuits may be placed in the non-display area (NA). Meanwhile, the non-display area NA may be located on the back of the substrate 110, that is, on the side without the sub-pixel SP, or may be omitted, and is not limited to what is shown in the drawing.

The display device 100 of the embodiment may drive the light emitting device including an active matrix (AM) method or a passive matrix (PM) method.

Hereinafter, FIGS. 2 and 3 will be referred to together for a more detailed description of the plurality of sub-pixels (SP).

FIG. 2 is a schematic enlarged plan view of a display device according to an embodiment. FIG. 3 is a cross-sectional view taken along line III-III' of FIG. 2.

Referring to FIGS. 2 and 3, a display device 100 according to an embodiment may include Multiple scan wirings (SL), multiple data wirings (DL), multiple high potential power supply wirings (VDD), a plurality of assembly wirings 120, a plurality of reference wirings (RL) and a black matrix (BM), and a plurality of sub-pixels (SP), each of the first transistor (TR1), second transistor (TR2), third transistor (TR3), storage capacitor (ST), semiconductor light emitting device (LED), light blocking layer (LS), buffer layer 111, gate insulating layer 112, a plurality of passivation layers (113, 115, 116), a plurality of planarization layers (114, 117, 118), a connection electrode (CE), a pixel electrode.

Referring to FIGS. 2 and 3, a plurality of data wirings DL, a first layer (VDD1) and a second layer (VDD2) of the high-potential power wiring (VDD), a plurality of reference wirings (RL), and a plurality of assembly wiring 120 may extend in the column direction between the plurality of sub-pixels SP.

The third layer VDD3 of the plurality of scan lines SL and the high potential power line VDD may extend in the row direction between the plurality of sub-pixels SP. Additionally, a first transistor TR1, a second transistor TR2, a third transistor TR3, and a storage capacitor ST may be disposed in each of the plurality of sub-pixels SP.

First, the first layer (VDD1) and the light blocking layer (LS) of the high-potential power line (VDD) may be disposed on the substrate 110.

The high-potential power supply line (VDD) is a line that transmits a high-potential power supply voltage to each of the plurality of sub-pixels (SP). A plurality of high-potential power supply lines (VDD) may transmit a high-potential power supply voltage to the second transistor TR2 of each of the plurality of sub-pixels (SP).

Meanwhile, the plurality of high-potential power supply wirings (VDD) may be made of a single layer or multiple layers. For convenience of explanation, hereinafter, the description will be made on the assumption that the plurality of high-potential power supply wirings (VDD) are made of a plurality of layers.

The high-potential power wiring (VDD) includes a plurality of first layers (VDD1), a plurality of second layers (VDD2), and a plurality of third layers (VDD3) connecting them. The first layer VDD1 may extend in the column direction between each of the plurality of sub-pixels SP.

A light blocking layer LS may be disposed in each of the plurality of sub-pixels SP on the substrate 110. The light blocking layer LS blocks light incident from the lower part of the substrate 110 to the second active layer ACT2 of the second transistor TR2, which will be described later, and may minimize leakage current.

The buffer layer 111 may be disposed on the first layer (VDD1) and the light blocking layer (LS) of the high-potential power line (VDD). The buffer layer 111 may reduce penetration of moisture or impurities through the substrate 110. The buffer layer 111 may include, for example, a single layer or a multiple layer of silicon oxide (SiOx) or silicon nitride (SiNx), but is not limited thereto. However, the buffer layer 111 may be omitted depending on the type of substrate 110 or the type of transistor, but is not limited thereto.

A plurality of scan wirings (SL), a plurality of reference wirings (RL), a plurality of data wirings (DL), a first transistor (TR1), the second transistor TR2, third transistor TR3, and storage capacitor ST may be disposed on the buffer layer 111.

First, the first transistor TR1 may be disposed in each of the plurality of sub-pixels SP. The first transistor TR1 may include a first active layer ACT1, a first gate electrode GE1, a first source electrode SE1, and a first drain electrode DE1. The first active layer (ACT1) may be disposed on the buffer layer (111). The first active layer (ACT1) may be made of a semiconductor material such as oxide semiconductor, amorphous silicon, or polysilicon, but is not limited thereto.

The gate insulating layer 112 may be disposed on the first active layer ACT1. The gate insulating layer 112 is an insulating layer for insulating the first active layer (ACT1)

and the first gate electrode (GE1), and may include a single layer or multiple layers of silicon oxide (SiOx) or silicon nitride (SiNx), but is not limited thereto.

The first gate electrode GE1 may be disposed on the gate insulating layer 112. The first gate electrode GE1 may be electrically connected to the scan line SL. The first gate electrode GE1 is made of a conductive material, such as copper (Cu), aluminum (Al), molybdenum (Mo), nickel (Ni), titanium (Ti), chromium (Cr), or an alloy thereof, but is not limited to this.

The first passivation layer 113 may be disposed on the first gate electrode GE1. Contact holes may be formed in the first passivation layer 113 to connect the first source electrode SE1 and the first drain electrode DE1 to the first active layer ACT1. The first passivation layer 113 is an insulating layer to protect the structure below the first passivation layer 113, and may include a single layer or multiple layers of silicon oxide (SiOx) or silicon nitride (SiNx), but is not limited thereto.

A first source electrode (SE1) and a first drain electrode (DE1) electrically connected to the first active layer (ACT1) may be disposed on the first passivation layer 113. The first drain electrode DE1 may be connected to the data line DL, and the first source electrode SE1 may be connected to the second gate electrode GE2 of the second transistor TR2. The first source electrode (SE1) and the first drain electrode (DE1) are made of a conductive material, such as copper (Cu), aluminum (Al), molybdenum (Mo), nickel (Ni), titanium (Ti), chromium (Cr) or an alloy thereof, but is not limited thereto.

Meanwhile, in the embodiment, each of the first source electrode (SE1) and the first drain electrode (DE1) is described as being connected to the second gate electrode (GE2) and the data line (DL), but depending on the type of transistor, the first source electrode SE1 may be connected to the data line DL, and the first drain electrode DE1 may be connected to the second gate electrode GE2 of the second transistor TR2, but are not limited thereto.

The first gate electrode GE1 of the first transistor TR1 is connected to the scan line SL and may be turned on or off depending on the scan signal. The first transistor TR1 may transfer a data voltage to the second gate electrode GE2 of the second transistor TR2 based on the scan signal, and may be referred to as a switching transistor.

Meanwhile, a plurality of data lines DL and a plurality of reference lines RL may be disposed on the gate insulating layer 112 along with the first gate electrode GE1. The plurality of data lines DL and the reference lines RL may be formed of the same material and process as the first gate electrode GE1.

The plurality of data lines DL are lines that transmit data voltages to each of the plurality of sub-pixels SP. The plurality of data lines DL may transmit data voltage to the first transistor TR1 of each of the plurality of sub-pixels SP. For example, the plurality of data lines (DL) include a data line (DL) that transmits the data voltage to the red sub-pixel (SPR), a data line (DL) that transmits the data voltage to the green sub-pixel (SPG), and a blue sub-pixel (DL) that transmits the data voltage to the red sub-pixel (SPR). It may include a data line (DL) that transmits a data voltage to the pixel (SPB).

The plurality of reference wirings RL are wirings that transmit a reference voltage to each of the plurality of sub-pixels SP. The plurality of reference lines RL may transmit a reference voltage to the third transistor TR3 of each of the plurality of sub-pixels SP.

A second transistor TR2 may be disposed in each of the plurality of sub-pixels SP. The second transistor TR2 may include a second active layer ACT2, a second gate electrode GE2, a second source electrode SE2, and a second drain electrode DE2. The second active layer (ACT2) may be disposed on the buffer layer 111. The second active layer ACT2 may be made of a semiconductor material such as oxide semiconductor, amorphous silicon, or polysilicon, but is not limited thereto.

The gate insulating layer 112 may be disposed on the second active layer ACT2, and the second gate electrode GE2 may be disposed on the gate insulating layer 112. The second gate electrode GE2 may be electrically connected to the first source electrode SE1 of the first transistor TR1. The second gate electrode GE2 is made of a conductive material, such as copper (Cu), aluminum (Al), molybdenum (Mo), nickel (Ni), titanium (Ti), chromium (Cr), or an alloy thereof, but is not limited to this.

The first passivation layer 113 may be disposed on the second gate electrode GE2, and the second source electrode SE2 and the second drain electrode DE2 may be disposed on the first passivation layer 113. The second source electrode SE2 may be electrically connected to the second active layer ACT2. The second drain electrode DE2 may be electrically connected to the second active layer ACT2 and at the same time may be electrically connected to the high potential power supply line VDD. The second drain electrode DE2 may be disposed between the first layer VDD1 and the second layer VDD2 of the high potential power line VDD and electrically connected to the high potential power line VDD.

The second transistor TR2 has a second gate electrode GE2 connected to the first source electrode SE1 of the first transistor TR1, and is turned on by the data voltage transmitted when the first transistor TR1 is turned on. And the turned-on second transistor TR2 may transfer a driving current to the light emitting device (LED) based on the high-potential power supply voltage from the high-potential power supply line (VDD), and thus may be referred to as a driving transistor.

A third transistor TR3 is disposed in each of the plurality of sub-pixels SP. The third transistor TR3 includes a third active layer ACT3, a third gate electrode GE3, a third source electrode SE3, and a third drain electrode DE3. The third active layer (ACT3) may be disposed on the buffer layer 111. The third active layer (ACT3) may be made of a semiconductor material such as oxide semiconductor, amorphous silicon, or polysilicon, but is not limited thereto.

The gate insulating layer 112 may be disposed on the third active layer ACT3, and the third gate electrode GE3 may be disposed on the gate insulating layer 112. The third gate electrode GE3 is connected to the scan line SL, and the third transistor TR3 may be turned on or off by the scan signal. The third gate electrode GE3 is made of a conductive material, such as copper (Cu), aluminum (Al), molybdenum (Mo), nickel (Ni), titanium (Ti), chromium (Cr), or an alloy thereof, but is not limited to this.

However, although it is explained that the third gate electrode (GE3) and the first gate electrode (GE1) are connected to the same scan line (SL), the third gate electrode (GE3) is a different scan line from the first gate electrode (GE1). It may be connected to (SL), but is not limited to this.

The first passivation layer 113 may be disposed on the third gate electrode GE3, and the third source electrode SE3 and the third drain electrode DE3 may be disposed on the first passivation layer 113. The third source electrode (SE3) is formed integrally with the second source electrode (SE2), is electrically connected to the third active layer (ACT3), and is electrically connected to the second source electrode (SE2) of the second transistor (TR2). And the third drain electrode DE3 may be electrically connected to the reference wiring RL.

The third transistor TR3 may be electrically connected to the second source electrode (SE2), the reference line (RL), and the storage capacitor (ST) of the second transistor (TR2), which is a driving transistor. It may be referred to as a sensing transistor.

A storage capacitor (ST) may be disposed in each of the plurality of sub-pixels (SP). The storage capacitor ST includes a first capacitor electrode ST1 and a second capacitor electrode ST2. The storage capacitor ST is connected between the second gate electrode GE2 and the second source electrode SE2 of the second transistor TR2, and stores the voltage while the light emitting device LED emits light. The voltage level of the gate electrode of TR2) may be maintained constant.

The first capacitor electrode ST1 may be integrated with the second gate electrode GE2 of the second transistor TR2. Accordingly, the first capacitor electrode ST1 may be electrically connected to the second gate electrode GE2 of the second transistor TR2 and the first source electrode SE1 of the first transistor TR1.

The second capacitor electrode may be disposed on the first capacitor electrode ST1 with the first passivation layer 113 interposed therebetween. The second capacitor electrode ST2 may be integrated with the second source electrode SE2 of the second transistor TR2 and the third source electrode SE3 of the third transistor TR3. Accordingly, the second capacitor electrode ST2 may be electrically connected to the second transistor TR2 and the third transistor TR3.

Meanwhile, the first source electrode (SE1), the first drain electrode (DE1), the second source electrode (SE2), the second drain electrode (DE2), the third source electrode (SE3), the third drain electrode (DE3) and a plurality of scan lines SL are disposed on the first passivation layer 113 along with the second capacitor electrode ST2.

The plurality of scan wirings (SL) are wirings that transmit scan signals to each of the plurality of sub-pixels (SP). The plurality of scan lines SL may transmit scan signals to the first transistor TR1 of each of the plurality of sub-pixels SP. For example, each of the plurality of scan lines SL extends in the row direction and may transmit a scan signal to a plurality of sub-pixels SP arranged in the same row.

Next, the first planarization layer 114 may be disposed on a plurality of scan wires (SL), a plurality of reference wires (RL), a plurality of data wires (DL), a first transistor (TR1), a second transistor (TR2), a third transistor (TR3), and a storage capacitor (ST). The first planarization layer 114 may planarize the upper part of the substrate 110 on which the plurality of transistors are disposed. The first planarization layer 114 may be composed of a single layer or a double layer, and may be made of, for example, an acryl-based organic material, but is not limited thereto.

A second passivation layer 115 may be disposed on the first planarization layer 114. The second passivation layer 115 is an insulating layer to protect the structure below the second passivation layer 115 and improve the adhesion of the structure formed on the second passivation layer 115, and is made of silicon oxide (SiOx) or it may include a single layer or multiple layers of silicon nitride (SiNx), but is not limited thereto.

On the second passivation layer 115, a second layer (VDD2) of the high potential power supply wiring (VDD), a plurality of first assembly wirings 121 among the plurality of assembly wirings 120, and a connection electrode (CE) will be disposed.

First, the plurality of assembly wirings 120 generate an electric field to align the plurality of light emitting devices (LEDs) when manufacturing the display device 100, and the plurality of light emitting devices (LEDs) are aligned when the display device 100 is driven. It may be wiring that supplies a low-potential power supply voltage. Accordingly, the assembly wiring 120 may be referred to as a low-potential power wiring. The plurality of assembly wirings 120 are arranged in a column direction along the plurality of sub-pixels SP arranged on the same line. The plurality of assembly wirings 120 may be arranged to overlap the plurality of sub-pixels SP arranged in the same column. For example, one first assembly wiring 121 and a second assembly wiring 122 are disposed in the red sub-pixel (SPR) arranged in the same column, and one first assembly wiring (122) is disposed in the green sub-pixel (SPG). 121) and a second assembly wiring 122 are disposed, and one first assembly wiring 121 and a second assembly wiring 122 may be disposed in the blue sub-pixel SPB.

The plurality of assembly wirings 120 may include a plurality of first assembly wirings 121 and a plurality of second assembly wirings 122. When the display device 100 is driven, a low-potential voltage may be applied in alternating current to the plurality of first assembly wirings 121 and the plurality of second assembly wirings 122. The plurality of first assembly wirings 121 and the plurality of second assembly wirings 122 may be alternately arranged. Additionally, in each of the plurality of sub-pixels SP, one first assembly wiring 121 and one second assembly wiring 122 may be disposed adjacent to each other.

The plurality of first assembly wirings 121 and the plurality of second assembly wirings 122 may be made of a conductive material, for example, copper (Cu) and chromium (Cr), but are not limited thereto.

The plurality of first assembly wirings 121 may include a first conductive layer 121*a* and a first clad layer 121*b*. The first conductive layer 121*a* may be disposed on the second passivation layer 115. The first clad layer 121*b* may be in contact with the first conductive layer 121*a*. For example, the first clad layer 121*b* may be disposed to cover the top and side surfaces of the first conductive layer 121*a*. And the first conductive layer 121*a* may have a thickness greater than that of the first clad layer 121*b*.

The first clad layer 121*b* is made of a material that is more resistant to corrosion than the first conductive layer 121*a*, and when manufacturing the display device 100, the first conductive layer 121*a* of the first assembly wiring 121 and the second assembly wiring (Short circuit defects due to migration between the second conductive layers 122*a* of 122) may be minimized. For example, the first clad layer 121*b* may be made of molybdenum (Mo), molybdenum titanium (MoTi), etc., but is not limited thereto.

A second layer (VDD2) of the high potential power supply line (VDD) is disposed on the second passivation layer (115). The second layer (VDD2) extends in the column direction between each of the plurality of sub-pixels (SP) and may overlap the first layer (VDD1). The first layer (VDD1) and the second layer (VDD2) may be electrically connected through a contact hole formed in the insulating layers formed between the first layer (VDD1) and the second layer (VDD2). The second layer VDD2 may be formed of the same material and process as the first assembly wiring 121, but is not limited thereto.

A connection electrode (CE) may be disposed in each of the plurality of sub-pixels (SP). The connection electrode CE is electrically connected to the second capacitor electrode ST2 and the second source electrode SE2 of the second transistor TR2 through a contact hole formed in the second passivation layer 115. The connection electrode (CE) is an electrode for electrically connecting the light emitting device (LED) and the second transistor (TR2), which is a driving transistor, and includes a first connection layer (CE1) and a second connection layer (CE2). For example, the first connection layer CE1 may be formed of the same material on the same layer as the first conductive layer 121*a* of the first assembly wiring 121, and the second connection layer CE2 may be formed of the same material as the first conductive layer 121*a* of the first assembly wiring 121 and may be formed of the same material as the layer 121*b*.

Subsequently, a third passivation layer 116 may be disposed on the second layer VDD2, the first assembly wiring 121, and the connection electrode CE. The third passivation layer 116 is an insulating layer to protect the structure below the third passivation layer 116, and may include a single layer or multiple layers of silicon oxide (SiOx) or silicon nitride (SiNx), but is not limited thereto. In addition, the third passivation layer 116 may function as an insulating layer to prevent short circuit defects due to migration between the first assembly wiring 121 and the second assembly wiring 122 when manufacturing the display device 100. This will be described later with reference to FIGS. 4A and 4B.

Among the plurality of assembly wirings 120, a plurality of second assembly wirings 122 may be disposed on the third passivation layer 116. Each of the plurality of second assembly wirings 122 is disposed in a plurality of sub-pixels (SP) arranged on the same line as described above, and the plurality of first assembly wirings 121 and the plurality of second assembly wirings 122 may be placed spaced apart from each other.

Each of the plurality of second assembly wirings 122 may include a second conductive layer 122*a* and a second clad layer 122*b*. The second conductive layer 122*a* is disposed on the third passivation layer 116. And the second clad layer 122*b* may be electrically connected to the second conductive layer 122*a*. For example, the second clad layer 122*b* may be disposed to cover the top and side surfaces of the second conductive layer 122*a*. And the second conductive layer 122*a* may have a thickness greater than that of the second clad layer 122*b*.

The second clad layer 122*b*, like the first clad layer 121*b*, is also made of a material that is more resistant to corrosion than the second conductive layer 122*a*, when manufacturing the display device 100, short-circuit defects due to migration between the first assembly wiring 121 and the second assembly wiring 122 may be minimized. For example, the second clad layer 122*b* may be made of molybdenum (Mo), molybdenum titanium (MoTi), etc., but is not limited thereto.

Next, the second planarization layer 117 may be disposed on the plurality of second assembly wirings 122. The second planarization layer 117 may include a single layer or a double layer, and may be made of, for example, an acryl-based organic material, but is not limited thereto.

Meanwhile, the second planarization layer 117 may include a plurality of first openings 117*a* on which each of the plurality of light emitting devices (LEDs) is seated, and a plurality of second openings 117*b* exposing each of the plurality of connection electrodes (CE).

A plurality of first openings 117*a* may be disposed in each of the plurality of sub-pixels SP.

At this time, one or more first openings 117*a* may be disposed in one sub-pixel SP. For example, one first opening 117*a* or two first openings 117*a* may be disposed in one sub-pixel SP.

The plurality of first openings 117*a* are parts into which a plurality of light emitting devices (LEDs) are inserted, and may in addition be referred to as pockets. The plurality of first openings 117*a* may be formed to overlap the plurality of assembly wirings 120. For example, one first opening 117*a* may overlap the first assembly wiring 121 and the second assembly wiring 122 disposed adjacent to each other in one sub-pixel SP.

Additionally, a portion of the second clad layer 122*b* of the plurality of second assembly wirings 122 may be exposed through the first opening 117*a*. On the other hand, because the third passivation layer 116 covers all of the first assembly wiring 121 in the first opening 117*a*, the first assembly wiring 121 overlaps the first opening 117*a*, but may not be exposed from the first opening 117*a*.

In order to form the second assembly wiring 122 in a partial area on the third passivation layer 116, it includes depositing a layer for forming the second assembly wiring 122 on the entire surface of the third passivation layer 116 and etching a portion of the second assembly wiring 122. In this case, the third passivation layer 116 may be damaged by the etchant during the process of etching the second assembly wiring 122.

In particular, it is vulnerable in the step area (SA), the insulating properties of the third passivation layer 116 may be weakened in the step area SA, which may cause damage to the first clad layer 121*b* and the first conductive layer 121*a*. Damage to the first clad layer 121*b* and the first conductive layer 121*a* may reduce the transfer rate of the light emitting device (LED). To solve this problem, the thickness of the third passivation layer 116 may be increased but the increase in the thickness of the third passivation layer 116 within the first opening 117*a* may weaken the electric field generated by the assembly wiring, thereby reducing the transfer rate of the light emitting device (LED). Therefore, structural improvement is needed to solve this problem, and the improved structure will be described in the embodiments described later.

A plurality of second openings 117*b* may be disposed in a plurality of sub-pixels SP. The plurality of second openings 117*b* are portions that expose the connection electrodes CE of each of the plurality of sub-pixels SP. The connection electrode (CE) under the second planarization layer 117 is exposed through the plurality of second openings 117*b* and may be electrically connected to the light emitting device (LED), and the driving current from the second transistor TR2 may be transmitted to the light emitting device (LED). In this case, the third passivation layer 116 may have a contact hole in the area overlapping the second opening 117*b*, and the connection electrode CE may be exposed from the second planarization layer 117 and the third passivation layer 116.

A plurality of light emitting devices (LEDs) may be disposed in a plurality of first openings 117*a*. The plurality of light emitting devices (LEDs) are light emitting devices (LEDs) that emit light by electric current. The plurality of light emitting devices (LEDs) may include light emitting devices (LEDs) that emit red light, green light, blue light, etc., and a combination of these may produce light of various colors, including white. For example, the light emitting device (LED) may be a light emitting diode (LED) or a micro LED, but is not limited thereto. In this case, micro LED means that the size of the light emitting device is 100 μm or less.

Hereinafter, the plurality of light emitting devices (LEDs) will be described assuming that they include the red light emitting device 130 disposed in the red sub-pixel (SPR), a green light emitting device 140 disposed in the green sub-pixel (SPG), and a blue light emitting device 150 disposed in the blue sub-pixel (SPB). However, the plurality of light emitting devices (LEDs) are composed of light emitting devices (LEDs) that emit light of the same color, and images of various colors may be displayed using a separate light conversion member that converts light from a plurality of light emitting devices (LEDs) into light of different colors, but is not limited thereto.

The plurality of light emitting devices (LEDs) may include a red light emitting device 130 disposed in the red sub-pixel (SPR), a green light emitting device 140 disposed in the green sub-pixel (SPG) and a blue light emitting device 150 disposed in the blue sub-pixel (SPB). Each of the red light emitting device 130, the green light emitting device 140, and the blue light emitting device 150 may include a first semiconductor layer, a second semiconductor layer, a first electrode, and a second electrode in common. And the red light emitting device 130 may include a light emitting layer that emits red light, the green light emitting device 140 includes a light emitting layer that emits green light, and the blue light emitting device 150 includes a light emitting layer that emits blue light.

Referring to FIG. 3, in the red light emitting device 130 disposed in the red sub-pixel (SPR), the second semiconductor layer 133 may be disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may include an AlInGaP-based semiconductor layer, for example, it may be a layer doped with a p-type or n-type impurity in a material such as indium aluminum phosphide (InAlP) or gallium arsenide (GaAs). The p-type impurities may be magnesium (Mg), zinc (Zn), beryllium (Be), etc., and the n-type impurities may be silicon (Si), germanium (Ge), tin (Sn), etc., but are not limited thereto.

The light emitting layer 132 that emits red light may be disposed between the first semiconductor layer 131 and the second semiconductor layer 133. The light emitting layer 132 may emit light by receiving holes and electrons from the first semiconductor layer 131 and the second semiconductor layer 133. The light emitting layer 132 may have a single-layer or multi-quantum well (MQW) structure.

The light emitting layer 132 may convert injected electrical energy into light with a specific wavelength within the range of about 570 nm to about 630 nm. The change in specific wavelength is determined by the size of the band gap of the light emitting diode. The band gap size may be adjusted by changing the composition ratio of Al and Ga. For example, as the composition ratio of Al increases, the wavelength becomes shorter.

The first electrode 134 may be disposed on the lower surface of the first semiconductor layer 131, and the second electrode 135 may be disposed on the upper surface of the second semiconductor layer 133. The first electrode 134 is an electrode bonded to the second assembly wiring 122 exposed in the first opening 117*a*, and the second electrode 135 is an electrode that electrically connects the second semiconductor layer 133 to a pixel electrode (PE), which will be described later. The first electrode 134 and the second electrode 135 may be formed of a conductive material.

In this case, in order to bond the first electrode 134 to the second assembly wiring 122, the first electrode 134 may be made of a eutectic metal. For example, the first electrode 134 may include Tin (Sn), indium (In), zinc (Zn), lead (Pb), nickel (Ni), gold (Au), platinum (Pt), copper (Cu), etc., but is not limited thereto.

And both the green light emitting device 140 and the blue light emitting device 150 may be formed with the same or similar structure as the red light emitting device 130. For example, the green light emitting device 140 may include a first electrode, a first semiconductor layer on the first electrode, a green light emitting layer on the first semiconductor layer, a second semiconductor layer on the green light emitting layer, and a second electrode on the second semiconductor layer, and the blue light emitting device may also include a structure in which a first electrode, a first semiconductor layer, a blue light emitting layer, a second semiconductor layer, and a second electrode are sequentially stacked.

However, the green light emitting device 140 and the blue light emitting device 150 may be formed of a compound selected from the group consisting of GaN, AlGaN, InGaN, AlInGaN, GaP, AlN, GaAs, AlGaAs, InP, and mixtures thereof, but is not limited thereto.

Meanwhile, although not shown in the drawing, an insulating layer surrounding a portion of each of the plurality of light emitting devices (LEDs) may be disposed. Specifically, the insulating layer may cover at least one side of the light emitting device (LED) among the outer surfaces of the plurality of light emitting devices (LED). Protects the light emitting device (LED) by forming an insulating layer on the light emitting device (LED), and when forming the first electrode 134 and the second electrode 135, electrical short circuit between the first semiconductor layer 131 and the second semiconductor layer 133 may be prevented.

Next, the third planarization layer 118 may be disposed on the plurality of light emitting devices (LEDs). The third planarization layer 118 may planarize the upper part of the substrate 110 on which a plurality of light emitting devices (LEDs) are disposed, and a plurality of light emitting devices (LEDs) may be stably fixed in the first opening 117*a* by the third planarization layer 118. The third planarization layer 118 may be composed of a single layer or a double layer, and may be made of, for example, an acryl-based organic material, but is not limited thereto.

The pixel electrode PE may be disposed on the third planarization layer 118. The pixel electrode (PE) is an electrode for electrically connecting a plurality of light emitting devices (LED) and the connection electrode (CE). The pixel electrode (PE) may be electrically connected to the light emitting device (LED) of the first opening (117*a*) and the connection electrode (CE) of the second opening (117*b*) through a contact hole formed in the third planarization layer (118). Accordingly, the second electrode 135 of the light emitting device (LED), the connection electrode (CE), and the second transistor (TR2) may be electrically connected through the pixel electrode (PE).

The third layer (VDD3) of the high potential power line (VDD) may be disposed on the third planarization layer 118. The third layer (VDD3) may electrically connect the first layer (VDD1) and the second layer (VDD2) arranged in different rows. For example, the third layer (VDD3) extends in the row direction between the plurality of sub-pixels (SP), and may electrically connect the plurality of second layers (VDD2) of the high potential power supply line (VDD)

extending in the column direction to each other. In addition, as the plurality of high-potential power supply lines (VDD) are connected in a mesh form through the third layer (VDD3), there is a technical effect of reducing the voltage drop phenomenon.

The black matrix BM may be disposed on the third planarization layer 118. The black matrix BM may be disposed between the plurality of sub-pixels SP on the third planarization layer 118. The black matrix (BM) may reduce color mixing between the plurality of sub-pixels (SP). The black matrix (BM) may be made of an opaque material, for example, black resin, but is not limited thereto.

The protective layer 119 may be disposed on the pixel electrode (PE), the third planarization layer 118, and the black matrix (BM). The protective layer 119 is a layer to protect the structure below the protective layer 119, and may be composed of a single layer or multiple layers of translucent epoxy, silicon oxide (SiOx), or silicon nitride (SiNx), but is not limited thereto.

Meanwhile, in the first opening 117*a*, the plurality of first assembly wirings 121 are spaced apart from the plurality of light emitting devices (LED), and only the plurality of second assembly wirings 122 may contact the plurality of light emitting devices (LEDs). This is to prevent defects that occur when a plurality of light emitting devices (LEDs) come into contact with both the first assembly wiring 121 and the plurality of second assembly wiring 122 during the manufacturing process of the display device 100. The third passivation layer 116 may be formed on the plurality of first assembly wirings 121, and the plurality of light emitting devices (LEDs) may be contacted only to the plurality of second assembly wirings 122. Hereinafter, a method of manufacturing the display device 100 according to an embodiment will be described in detail with reference to FIGS. 4A and 4B.

FIGS. 4A and 4B are process charts for explaining a manufacturing method of a display device according to an embodiment, and are process charts for explaining a process for self-assembling a plurality of light emitting devices (LEDs) into the first opening 117*a*.

Referring to FIG. 4A, a light emitting device (LED) is introduced into the chamber (CB) filled with the fluid (WT). The fluid WT may include water, etc., and the chamber CB filled with the fluid WT may have an open top.

Next, the mother substrate 10 may be placed on the chamber (CB) filled with light emitting devices (LEDs). The mother substrate 10 is a substrate composed of a plurality of substrates 110 forming the display device 100, when self-assembling a plurality of light emitting devices (LEDs), the mother substrate 10 on which a plurality of assembly wirings 120 and a second planarization layer 117 are formed may be used.

And the mother substrate 10 formed with the first assembly wiring 121, the second assembly wiring 122, and the second planarization layer 117 is placed on the chamber CB or inserted into the chamber CB. In this case, the mother substrate 10 may be positioned so that the first opening 117*a* of the second planarization layer 117 and the fluid WT face each other.

Next, the magnet MG may be placed on the mother substrate 10. Light emitting devices (LEDs) that sink or float on the bottom of the chamber (CB) may move toward the mother substrate 10 by the magnetic force of the magnet (MG).

In this case, the light emitting device (LED) may include a magnetic material to move by a magnetic field. For example, the first electrode 134 or the second electrode 135 of the light emitting device (LED) may include a ferromagnetic material such as iron, cobalt, or nickel.

Next, the light emitting device (LED) moved toward the second planarization layer 117 by the magnet (MG) may be self-assembled in the first opening 117*a* by the electric field formed by the first assembly wiring 121 and the second assembly wiring 122.

An alternating voltage may be applied to the plurality of first assembly wirings 121 and the plurality of second assembly wirings 122 to generate an electric field. Due to this electric field, the light emitting device (LED) is dielectrically polarized and may have polarity. And a dielectric polarized light emitting device (LED) may be moved or fixed in a specific direction by dielectrophoresis (DEP), that is, an electric field. Therefore, a plurality of light emitting devices (LEDs) may be fixed within the first opening 117*a* of the second planarization layer 117 using dielectrophoresis.

Next, in a state in which the light emitting device (LED) is fixed in the first opening 117*a* using the electric field of the plurality of first assembly wirings 121 and the plurality of second assembly wirings 122, the motherboard substrate 10 may be flipped 180°. In the embodiment, the mother substrate 10 may be turned over while voltage is applied to the plurality of first assembly wirings 121 and the plurality of second assembly wirings 122 and a subsequent process may be performed.

And with the first electrode 134 of the light emitting device (LED) located on the second assembly wiring 122, the light emitting device (LED) may be bonded to the second assembly wiring 122 by applying heat and pressure to the light emitting device (LED). For example, the first electrode 134 of the light emitting device (LED) may be bonded to the second assembly wiring 122 through eutectic bonding. Eutectic bonding is a bonding method using heat compression at high temperatures and is one of the bonding processes that is very strong and highly reliable. The eutectic bonding method not only realizes high bonding strength, but also has the advantage of eliminating the need to apply a separate adhesive from the outside. However, the bonding method of the plurality of light emitting devices (LEDs) may be configured in various ways other than eutectic bonding, but is not limited thereto.

Meanwhile, different voltages are applied to the plurality of first assembly wirings 121 and the plurality of second assembly wirings 122 when manufacturing the display device 100. The same voltage may be applied when driving the display device 100. To this end, when manufacturing the display device 100, the plurality of first assembly wirings 121 and the plurality of second assembly wirings 122 may be connected to different assembly pads and different voltages may be applied.

Therefore, after placing the mother substrate 10 in the chamber (CB) into which a plurality of light emitting devices (LEDs) are inserted, an electric field may be formed by applying an alternating voltage to a plurality of assembly wirings 120 through a plurality of assembly pads, and a plurality of light emitting devices (LEDs) may be easily self-assembled into the first opening 117*a* of the second planarization layer 117.

On the other hand, when self-assembling a plurality of light emitting devices (LEDs) for each sub-pixel (SP), a plurality of assembly wirings 120 arranged in a plurality of red sub-pixels (SPR), a plurality of assembly wirings 120 arranged in a plurality of green sub-pixels (SPG), a plurality of assembly wirings 120 arranged in a plurality of blue sub-pixels (SPB) may be connected to different assembly pads.

The light emitting device (LED) may be selectively self-assembled only in a specific sub-pixel (SP) among the plurality of sub-pixels (SP) through a plurality of assembly pads. The self-assembled mother substrate 10 may be separated into a plurality of substrates 110 by scribing. Thereafter, through the link wire connecting the plurality of first assembly wirings 121 into one and the link wire connecting the plurality of second assembly wirings 122 into one, the same voltage may be easily applied to the plurality of first assembly wirings 121 and the plurality of second assembly wirings 122.

In the display device 100 according to the embodiment, at least some of the plurality of assembly wirings 120 for self-assembly of the plurality of light emitting devices (LEDs) may be used as wiring for applying a low-potential power supply voltage to the plurality of light emitting devices (LEDs). When manufacturing the display device 100, a plurality of light emitting devices (LEDs) floating in the fluid WT may be moved adjacent to the mother substrate 10 using a magnetic field.

Next, different voltages may be applied to the plurality of first assembly wirings 121 and the plurality of second assembly wirings 122 to form an electric field, and a plurality of light emitting devices (LEDs) may be self-assembled within the plurality of first openings 117*a* by an electric field.

In this case, instead of separately forming a wiring supplying a low-potential voltage and connecting it to a plurality of self-assembled light emitting devices (LEDs), by bonding the first electrode 134 of the light emitting device (LED) to the second assembly wiring 122, a portion of which is exposed within the first opening 117*a*, when driving the display device 100, a plurality of assembly wirings 120 may be used as wiring for supplying low-potential voltage to a plurality of light emitting devices (LEDs). Accordingly, in the display device 100 according to the embodiment, the plurality of assembly wirings 120 may be used not only for self-assembly of the plurality of light emitting devices (LED) but also as wiring for driving the plurality of light emitting devices (LED).

In the display device 100 according to the embodiment, the plurality of assembly wiring 120 includes a clad layer, so that corrosion of the plurality of assembly wiring 120 and short circuit defects may be reduced. The plurality of first assembly wirings 121 are composed of a first conductive layer 121*a* and a first clad layer 121*b* that surrounds the first conductive layer 121*a* and is more resistant to corrosion than the first conductive layer 121*a*, and the plurality of second assembly wirings 122 includes a second conductive layer 122*a* and a second clad layer 122*b* that surrounds the second conductive layer 122*a* and is more resistant to corrosion than the second conductive layer 122*a*. When manufacturing the display device 100, the mother substrate 10 on which the plurality of assembly wirings 120 are formed is placed in the fluid WT to self-assemble the plurality of light emitting devices (LEDs).

In this case, the first conductive layer 121*a* and/or the second conductive layer 122*a* may be exposed in the fluid WT and the assembly wiring 120 may be corroded, which may cause a short circuit defect. Therefore, the first conductive layer 121*a* of the plurality of first assembly wirings 121 may be covered with the second passivation layer 115 and the first clad layer 121*b*, and the second conductive layer 122*a* of the plurality of second assembly wirings 122 may be covered with the third passivation layer 116 and the second clad layer 122*b*. Accordingly, the plurality of assembly wiring lines 120 are formed in a structure including the first clad layer 121*b* and the second clad layer 122*b*, thereby improving the reliability of the plurality of assembly wiring lines 120.

Next, FIG. 5 is a cross-sectional view of the display device according to the second embodiment. The display device 500 of FIG. 5 has a different third passivation layer 516 compared to the display device 100 of FIGS. 1 to 3, and the description will focus on these features. Referring to FIG. 5, the first conductive layer 121*a* of the first assembly wiring 121 and the second conductive layer 522*a* of the second assembly wiring 122 overlap the second planarization layer 117. The second planarization layer 117 may cover both the first conductive layer 121*a* of the first assembly wiring 121 and the first conductive layer 522*a* of the second assembly wiring 522, the first conductive layer 121*a* and the second conductive layer 522*a* may be spaced apart from the first opening 117*a*.

The first clad layer 121*b* of the first assembly wiring 121 may be disposed between the first conductive layer 121*a* and the second planarization layer 117 to cover the first conductive layer 121*a*. And instead of the first conductive layer 121*a* that does not overlap the first opening 117*a*, the first clad layer 121*b* extends toward the first opening 117*a* to form an electric field for self-assembly of the light emitting device (LED).

A portion of the first clad layer 121*b* may overlap the second planarization layer 117 and cover the top and side surfaces of the first conductive layer 121*a*. Additionally, the remaining portion of the first clad layer 121*b* may extend inside the first opening 117*a* and overlap the light emitting device LED. However, since the third passivation layer 516 is disposed on the first clad layer 121*b*, the first clad layer 121*b* does not contact the first electrode 134 of the light emitting device (LED).

The second clad layer 522*b* of the plurality of second assembly wirings 522 may be disposed between the second conductive layer 522*a* and the second planarization layer 117 to cover the second conductive layer 522*a*. And instead of the second conductive layer 522*a* that does not overlap the first opening 117*a*, the second clad layer 522*b* extends toward the first opening 117*a*, an electric field for self-assembly of a light emitting device (LED) may be formed together with the first clad layer 121*b*.

A portion of the second clad layer 522*b* may overlap the second planarization layer 117 and cover the top and side surfaces of the second conductive layer 522*a*. The remaining portion of the second clad layer 522*b* may extend inside the first opening 117*a* and overlap the light emitting device (LED). In this case, since the second clad layer 522*b* is disposed on the third passivation layer 516, the second clad layer 522*b* and the first electrode 134 of the plurality of light emitting devices (LEDs) may be in contact with each other, and a low-potential power supply voltage from the second assembly wiring 522 may be supplied to the light emitting devices (LEDs).

As mentioned above, during the patterning process of the second conductive layer 522*a* and the second clad layer 522*b*, to prevent damage to the first clad layer 121*a* and the first conductive layer 121*a* by the etchant, the thickness of the third passivation layer 516 may be increased. Even if the third passivation layer 516 of increased thickness is etched to some extent by the etchant of the second conductive layer 522*a* and the second clad layer 522*b*, there is a technical effect of maintaining insulation characteristics from the first conductive layer 121*a* and the first clad layer 121*b* in the step area SA.

In order to maintain the assembly characteristics of the light emitting device (LED), the third passivation layer 516 with an increased thickness may be additionally etched within the first opening 117*a*.

Accordingly, the thickness of the third passivation layer 516 may have a first thickness D1 in the area within the first opening 117*a* and a second thickness D2 in areas other than the first opening 117*a*. The first thickness D1 of the third passivation layer 516 is different from the second thickness D2, and the first thickness D1 may be thinner than the second thickness D2. For example, the second thickness D2 of the third passivation layer 516 may be more than twice the first thickness D1.

In the display device 500 according to the second embodiment, by increasing the thickness of the third passivation layer 516, there is a technical effect of preventing destruction of the insulating properties of the third passivation layer 516 and damage to the first conductive layer 121*a* and the first clad layer 121*b*.

In addition, the plurality of first assembly wirings 121 include a first conductive layer 121*a* and a first clad layer 121*b* that is more resistant to corrosion than the first conductive layer 121*a*, and the plurality of second assembly wiring 522 may include a second conductive layer 522*a* and a second clad layer 522*b* that is more resistant to corrosion than the second conductive layer 522*a*.

In this case, a first clad layer (121*b*), a second clad layer (522*b*), and a second planarization layer (117) are formed to cover the first conductive layer (121*a*) and the second conductive layer (522*a*), which are relatively vulnerable to corrosion, the first conductive layer 121*a* and the second conductive layer 522*a* may be prevented from being exposed to the fluid WT. And instead of the first conductive layer 121*a* and the second conductive layer 522*a* covered with the second planarization layer 117, the first clad layer 121*b* and the second clad layer 522*b* extend inside the first opening 117*a* to form an electric field that induces self-assembly of the light emitting device (LED).

In addition, after self-assembly is completed, on the second clad layer 522*b* extending inside the first opening 117*a*, the second assembly wiring 522 and the light emitting device (LED) may be electrically connected by bonding the first electrode 134 of the light emitting device (LED). Accordingly, in the display device 500 according to the second embodiment, only the first clad layer 121*b* and the second clad layer 522*b* of each of the plurality of assembly wirings 520 are disposed in the first opening 117*a*, there is a technical effect of reducing corrosion and short circuit defects in the plurality of assembly wiring 520.

In the display device 500 according to the second embodiment, the bonding process of the plurality of light emitting devices (LEDs) may be easily performed with a low step difference between the first clad layer 121*b* and the second clad layer 522*b* in the first opening 117*a*. Specifically, only the first clad layer 121*b* and the second clad layer 522*b* among the plurality of assembly lines 520 may be disposed within the first opening 117*a* where the plurality of light emitting devices (LEDs) are seated. In this case, the first clad layer 121*b* and the second clad layer 522*b* have a thinner thickness than the first conductive layer 121*a* and the second conductive layer 522*a*.

Therefore, when a plurality of light emitting devices (LEDs) are located in the first opening 117*a*, the gap between the plurality of light emitting devices (LED) and the first clad layer 121*b*, that is, it is possible to minimize the case where a plurality of light emitting devices (LEDs) are arranged in an unstable state floating in an empty space on the first clad layer 121*b*, there is a technical effect of stably bonding a plurality of light emitting devices (LEDs) on the second clad layer 522*b*.

FIG. 6 is a cross-sectional view of a display device according to a third embodiment. The third embodiment may adopt the features of the second embodiment.

Referring to FIG. 6, the first assembly wiring 121 is disposed between the first conductive layer 121*a* and the second passivation layer 115 and the third passivation layer 616, the first clad layer 121*b* may be disposed between the first conductive layer 121*a* and the third passivation layer 616.

A portion of the first clad layer 121*b* is in contact with the upper surface of the first assembly wiring 121 and may overlap the second planarization layer 117. The remaining portion of the first clad layer 121*b* may extend inside the first opening 117*a* and overlap the light emitting device LED.

The second conductive layer 622*a* of the second assembly wiring 622 may be disposed on the third passivation layer 616, and the second clad layer 622*b* may be disposed on the second conductive layer 622*a*.

A portion of the second clad layer 622*b* may overlap the second conductive layer 622*a* and the second planarization layer 117 at the same time. The remaining portion of the second clad layer 622*b* extends inside the first opening 117*a* and may be electrically connected to the light emitting device (LED). That is, the first electrodes 134 of the plurality of light emitting devices (LEDs) may be electrically connected only to the second clad layer 622*b*.

During the patterning process of the second conductive layer 622*a* and the second clad layer 622*b*, to prevent damage to the third passivation layer 616 by the etchant, a fourth passivation layer 615 may be disposed between the first assembly wiring 121 and the third passivation layer 616. The fourth passivation layer 615 covers the step area SA around the first opening 117*a* and may be disposed in the minimum area.

Specifically, the fourth passivation layer 615 may be arranged to cover the first clad layer 122*b* and overlap the first opening 117*a* and the second conductive layer 622*a*. Additionally, the fourth passivation layer 615 may have better insulating properties and step cover properties than the third passivation layer 615. For example, if the third passivation layer 615 is silicon oxide (SiOx), the fourth passivation layer 615 may be silicon nitride (SiNx), but is not limited thereto.

The arrangement area of the fourth passivation layer 615 is not limited to the above-mentioned area, and may be arranged to cover the step area SA and the first conductive layer 121*a*.

The third passivation layer 615 may be disposed on the fourth passivation layer 615. In this case, as shown in FIG. 6, the third passivation layer 616 may be a layer of increased thickness including the first thickness D1 and the second thickness D2, but is not limited thereto, and may be a layer of increased thickness as shown in FIG. 3. The third passivation layer 616 may be implemented with only one thickness D1.

In the display device 600 according to the third embodiment, the fourth passivation layer 615 is arranged to cover the area around the first opening 117*a* and the step area SA, so that damage to the first clad layer 121*b* and the first conductive layer 121*a* may be prevented and the assembly characteristics of the light emitting device 130 may be maintained.

Next, FIG. 7 is a cross-sectional view of a display device according to the fourth embodiment. The fourth embodiment may adopt the features of the second and third embodiments.

Referring to FIG. 7, the first conductive layer 121*a* of the first assembly wiring 121 is disposed on the second passivation layer 115, the first clad layer 121*b* may be disposed to cover the first conductive layer 121*a*. The first clad layer 121*b* covers the top and side surfaces of the first conductive layer 121*a* and may extend inside the first opening 117*a* of the second planarization layer 117 and overlap the light emitting device LED.

A portion of the first clad layer 121*b* is in contact with the upper surface of the first assembly wiring 121 and may overlap the second planarization layer 117. The remaining portion of the first clad layer 121*b* may extend inside the first opening 117*a* and overlap the light emitting device LED.

The second conductive layer 722*a* of the second assembly wiring 722 is disposed on the third passivation layer 716, and a third clad layer 722*c* may be disposed under the third passivation layer 716. The third passivation layer 716 may be disposed between the third clad layer 722*c* and the second conductive layer 722*a*. The third clad layer 722*c* is disposed under the second conductive layer 722*a* and may be electrically connected to the second conductive layer 722*a* through a contact hole formed in the third passivation layer 716.

A portion of the third clad layer 722*c* may overlap the second conductive layer 722*a* and the second planarization layer 117 at the same time. The remaining portion of the third clad layer 722*c* may extend inside the first opening 117*a* and be electrically connected to the light emitting device (LED).

The third clad layer 722*c* may be formed through the same process as the first clad layer 121*b* and may be formed of the same material on the same plane. Accordingly, process deviation between the third clad layer 722*c* and the first clad layer 121*b* may be reduced.

The third passivation layer 716 may be disposed on the first clad layer 121*b* and the third clad layer 722*c*, and the second conductive layer 722*a* may be disposed on the third passivation layer 716, and a second clad layer 722*b* may be disposed to cover the second conductive layer 722*a*.

The third passivation layer 716 is formed with a thickness sufficient to maintain the insulating properties of the step area SA, when patterning the second conductive layer 722*a* on the third passivation layer 716, damage to the first assembly wiring 121 may be prevented. Next, after patterning the second conductive layer 722*a*, an etching process is performed to reduce the thickness of the third passivation layer 716 in the area of the first opening 117*a*.

The third passivation layer 716 may have a first thickness D1 in the area within the first opening 117*a* and a second thickness D2 in the area outside the first opening 117*a*. The first thickness D1 of the third passivation layer 716 is different from the second thickness D2, and the first thickness D1 may be thinner than the second thickness D2.

For example, the second thickness D2 of the third passivation layer 716 may be more than twice the first thickness D1. By the third passivation layer 716 whose thickness is reduced in the area of the first opening 117*a*, there is a technical effect of improving the assembly rate during the assembly process of the light emitting device (LED) through the first assembly wiring 121 and the second assembly wiring 722.

In FIG. 7, the light emitting device (LED) is shown as if floating from the third passivation layer 716 without contacting the third passivation layer 716. In fact, the thickness of the third passivation layer 716 is very thin compared to the size of the light emitting device (LED), so the light emitting device (LED) may contact the third passivation layer 716.

In the display device 700 according to the fourth embodiment, by increasing the thickness of the third passivation layer 716, destruction of the insulating properties of the third passivation layer 716 and damage to the first conductive layer 121*a* and the first clad layer 121*b* may be prevented. In addition, by forming the third clad layer 722*c* on the same plane through the same process as the first clad layer 121*b*, process deviation is reduced, and by using it as the end of the electric field forming electrode when assembling a light emitting device (LED), so that there is a technical effect that may improve the electric field.

A second clad layer 722*b* covering the second conductive layer 722*a* may be disposed on the second conductive layer 722*a*. The second clad layer 722*b* may cover the top and side surfaces of the second conductive layer 722*a*.

And a second planarization layer 117 covering the second clad layer 722*b* and the third passivation layer 716 may be disposed. The second planarization layer 117 may be disposed to cover at least a portion of the second clad layer 722*b*. A portion of the second clad layer 722*b* may be exposed through the first opening 117*a* of the second planarization layer 117.

Instead of the first conductive layer 121*a* and the second conductive layer 722*a* covered with the second planarization layer 117, the first clad layer 121*b*, the second clad layer 722*b*, and the third clad layer 722*c* extend inside the first opening 117*a* may form an electric field that induces self-assembly of the light emitting device (LED). In addition, after self-assembly is completed, the first electrode 134 of the light emitting device (LED) is bonded on the second clad layer 522*b* extending inside the first opening 117*a*, the second assembly wiring 722 and the light emitting device (LED) may be electrically connected.

Therefore, in the display device 700 according to the fourth embodiment, only the first clad layer 121*b*, the second clad layer 722*b*, and the third clad layer 722*c* of each of the plurality of assembly wiring 720 are disposed in the first opening 117*a*, there is a technical effect of reducing corrosion and short circuit defects in the plurality of assembly wiring 720.

FIG. 8 is a cross-sectional view of a display device according to the fifth embodiment. The fifth embodiment may adopt the features of the second to fourth embodiments.

Referring to FIG. 8, the first conductive layer 121*a* of the first assembly wiring 121 may be disposed on the second passivation layer 115, and the first clad layer 121*b* may be disposed to cover the first conductive layer 121*a*. The first clad layer 121*b* overs the top and side surfaces of the first conductive layer 121*a*, and extends inside the third opening 127*a* of the fourth planarization layer 127 to overlap the light emitting device LED.

A portion of the first clad layer 121*b* is in contact with the upper surface of the first assembly wiring 121 and may overlap the second planarization layer 117. The remaining portion of the first clad layer 121*b* may extend inside the third opening 127*a* and overlap the light emitting device LED.

The second conductive layer 822*a* of the second assembly wiring 722 is disposed on the third passivation layer 816, a third clad layer 822*c* may be disposed under the third passivation layer 816. A third passivation layer 816 may be disposed between the third clad layer 822*c* and the second conductive layer 822*a*. The third clad layer 822*c* is disposed below the second conductive layer 822*a* and may be electrically connected to the second conductive layer 822*a* through a contact hole formed in the third passivation layer 816.

A portion of the third clad layer 822*c* may overlap the second conductive layer 822*a* and the second planarization layer 117 and the fourth planarization layer 127. The remaining portion of the third clad layer 822*c* may extend inside the third opening 127*a* and be electrically connected to the light emitting device (LED).

The third clad layer 822*c* may be formed through the same process as the first clad layer 121*b* and may be formed of the same material on the same plane. Accordingly, process deviation between the third clad layer 822*c* and the first clad layer 121*b* may be reduced.

The third passivation layer 816 is disposed on the first clad layer 121*b* and the third clad layer 822*c*, a second conductive layer 822*a* may be disposed on the third passivation layer 816, and a second clad layer 822*b* may be disposed to cover the second conductive layer 822*a*.

The display device 800 according to the fifth embodiment may include a reflective layer 850 disposed on the side of the second planarization layer 117 that exposes the area where the light emitting device (LED) will be disposed. Since the reflective layer 850 is formed of a metal material that may reflect light generated from the light emitting device (LED), the second clad layer 822*b* may include an opening so that the reflective layer 850 may float without being short-circuited with the second clad layer 822*b*. A reflective layer 850 is disposed in the opening of the second clad layer 822*b* and may contact the third passivation layer 816. For example, the reflective layer 850 may include aluminum (Al), but is not limited thereto.

The opening of the second clad layer 822*b* may divide the second clad layer 822*b* into two parts and space them apart. Contact holes are formed in the third passivation layer 816 to electrically connect the second clad layer 822*b*, which is divided into two, the two second clad layers 822*b* spaced apart from each other may be connected to the third clad layer 822*c* through the contact holes of the third passivation layer 816. Specifically, the contact holes formed in the third passivation layer 816 are formed around the opening of the second clad layer 822*b* and do not overlap the reflective layer 850. The second clad layer 822*b* overlapping the second planarization layer 117 is connected to the third clad layer 822*c* through a contact hole in the third passivation layer 816, the third clad layer 822*c* may be connected to the second clad layer 822*b* overlapping the opening of the second planarization layer 117 through another contact hole in the third passivation layer 816. In this case, the third clad layer 822*c* may not be connected to the second conductive layer 822*a* through the contact hole of the third passivation layer 816. Additionally, the third clad layer 822*c* may not extend to the third opening 127*a*.

The third passivation layer 816 is formed with a thickness sufficient to maintain the insulating properties of the step area SA, when patterning the second conductive layer 822*a* on the third passivation layer 816, damage to the first assembly wiring 121 is prevented. After patterning the second conductive layer 822*a*, an etching process is performed to reduce the thickness of the third passivation layer 816 in the third opening 127*a* area.

The thickness of the third passivation layer 816 may have a first thickness D1 in the area within the third opening 127*a* and a second thickness D2 in areas other than the third opening 127*a*. The first thickness D1 of the third passivation layer 816 is different from the second thickness D2, and the first thickness D1 may be thinner than the second thickness D2.

For example, the second thickness D2 of the third passivation layer 816 may be more than twice the first thickness D1. A third passivation layer 816 whose thickness is reduced in the area of the third opening 127*a* has a technical effect of improving the assembly rate during the assembly process of the light emitting device (LED) through the first assembly wiring 121 and the second assembly wiring 822.

As mentioned in FIG. 7, in FIG. 8, the light emitting device (LED) is shown as if floating from the third passivation layer 816 without contacting the third passivation layer 816, in fact, the thickness of the third passivation layer 816 is very thin compared to the size of the light emitting device (LED), so the light emitting device (LED) may contact the third passivation layer 816.

The second planarization layer 117 may be disposed on the second clad layer 822*b* and the third passivation layer 816, which have openings. The second planarization layer 117 overlaps the first conductive layer 121*a* and the second conductive layer 822*a* and has an opening so that the light emitting device (LED) arrangement area that overlaps a portion of the first clad layer 121*b* and a portion of the second clad layer 822*b* is exposed.

A reflective layer 850 may be disposed on the side of the second planarization layer 117 around the opening of the second planarization layer 117. The first reflective layer 850*a* may contact the third passivation layer 816, and the second reflective layer 850*b* may contact the third passivation layer 816 through an opening of the second clad layer 822*b*. The first reflective layer 850*a* and the second reflective layer 850*b* may be connected to each other and arranged to surround the opening of the second planarization layer 117. When the reflective layer completely surrounds the opening of the second planarization layer 117, the loss of light generated from the light emitting device (LED) may be significantly reduced.

A fourth planarization layer 127 may be disposed on the reflective layer 850 and the second planarization layer 117 to protect the reflective layer 850. The fourth planarization layer 127 includes a third opening 127*a* exposing the second clad layer 822*b* in the light emitting device (LED) arrangement area. For example, the fourth planarization layer 127 may be made of an acryl-based organic material, but is not limited thereto.

In the display device 800 according to the fifth embodiment, by increasing the thickness of the third passivation layer 816, it is possible to prevent destruction of the insulating properties of the third passivation layer 816 and damage to the first conductive layer 121*a* and the first clad layer 121*b*. In addition, there is a technical effect of reducing the loss of light generated from the light emitting device (LED) by disposing the reflective layer 850 around the opening where the light emitting device (LED) is disposed.

FIG. 9 is a cross-sectional view of a display device according to the sixth embodiment. The sixth embodiment may adopt the features of the second to fifth embodiments.

Referring to FIG. 9, the first conductive layer 121*a* of the first assembly wiring 121 and the second conductive layer 522*a* of the second assembly wiring 522 overlap the second planarization layer 117. The second planarization layer 117 may cover both the first conductive layer 121*a* of the first assembly wiring 121 and the first conductive layer 522*a* of the second assembly wiring 522, and the first conductive layer 121*a* and the second conductive layer 522*a* may be spaced apart from the third opening 127*a*.

The first clad layer 121*b* of the first assembly wiring 121 may be disposed between the first conductive layer 121*a* and the second planarization layer 117 to cover the first conductive layer 121*a*. And instead of the first conductive layer 121*a* that does not overlap the third opening 137*a*, the first clad layer 121*b* extends toward the third opening 127*a*, forming an electric field for self-assembly of the light emitting device (LED).

A portion of the first clad layer 121*b* may overlap the second planarization layer 117 and cover the top and side surfaces of the first conductive layer 121*a*. Additionally, the remaining portion of the first clad layer 121*b* may extend inside the third opening 127*a* and overlap the light emitting device (LED). However, since the third passivation layer 816 is disposed on the first clad layer 121*b*, the first clad layer 121*b* does not contact the first electrode 134 of the light emitting device (LED).

The second clad layer 522*b* of the plurality of second assembly wirings 522 may be disposed between the second conductive layer 522*a* and the second planarization layer 117 to cover the second conductive layer 522*a*. And, instead of the second conductive layer 522*a* that does not overlap the third opening 127*a*, the second clad layer 522*b* extends toward the third opening 127*a*, An electric field for self-assembly of a light emitting device (LED) may be formed together with the first clad layer 121*b*.

A portion of the second clad layer 522*b* may overlap the second planarization layer 117 and cover the top and side surfaces of the second conductive layer 522*a*. The remaining portion of the second clad layer 522*b* may extend inside the third opening 127*a* and overlap the light emitting device (LED). In this case, since the second clad layer 522*b* is disposed on the third passivation layer 816, the second clad layer 522*b* and the first electrode 134 of the light emitting device (LED) may be in contact with each other, and a low-potential power supply voltage from the second assembly wiring 522 may be supplied to the light emitting device (LED).

Even if the third passivation layer 816 is etched to some extent by the etchant of the second conductive layer 522*a* and the second clad layer 522*b*, and is formed with a thickness sufficient to maintain insulating properties from the first conductive layer 121*a* and the first clad layer 121*b* in the step area SA.

In order to maintain the assembly characteristics of the light emitting device (LED), the third passivation layer 516 of increased thickness may be additionally etched within the third opening 127*a*.

Accordingly, the thickness of the third passivation layer 816 is a first thickness D1 in the area within the third opening 127*a*) and has a second thickness D2 in the area outside the third opening 127*a*). The first thickness D1 of the third passivation layer 816 is different from the second thickness D2, and the first thickness D1 is thinner than the second thickness D2. For example, the second thickness D2 of the third passivation layer 816 may be more than twice the first thickness D1.

The display device 900 according to the sixth embodiment may include a reflective layer 950 disposed on the side of the second planarization layer 117 that exposes the area where the light emitting device (LED) will be disposed. The reflective layer 950 includes a first reflective layer 950*a* and a second reflective layer 950*b*, and is made of a metal material capable of reflecting light generated from the light emitting device (LED). For example, the reflective layer 950 may include aluminum (Al), but is not limited thereto.

The first reflective layer 950*a* and the second reflective layer 950*b* are disposed to be spaced apart from each other and are connected to the first clad layer 121*b* and the second clad layer 522*b*, respectively. Specifically, the first reflective layer is connected to the first clad layer 121*b* through a contact hole in the third passivation layer 816, and the second reflective layer 950*b* is connected to the second clad layer 522*b*.

In this case, the first reflective layer 950*a* and the second reflective layer 950*b* are spaced apart from each other and connected to assembly wirings, respectively, when assembling a light emitting device (LED), the control margin may be increased, which has the technical effect of facilitating the assembly of a light emitting device (LED).

In the display device 900 according to the sixth embodiment, by increasing the thickness of the third passivation layer 916, it is possible to prevent destruction of the insulating properties of the third passivation layer 916 and damage to the first conductive layer 121*a* and the first clad layer 121*b*. In addition, the loss of light generated from the light emitting device (LED) may be reduced by placing a reflective layer 950 around the opening where the light emitting device (LED) is disposed, there is a technical effect of improving the control margin when assembling a light emitting device (LED) by separating the reflective layer 950 into two and connecting each to the first assembly wiring 121 and the second assembly wiring 522.

Next, FIG. 10 is a cross-sectional view of the display device 1000 according to the seventh embodiment. The seventh embodiment may adopt the features of the second to sixth embodiments.

For example, the seventh embodiment has a first thickness D1 of the third passivation layer 516 in the area within the first opening 117*a* and a thickness D2 of the third passivation layer 516 in the area other than the first opening 117*a*, the first thickness D1 is formed to be thinner than the second thickness D2 to strengthen the assembly force of the assembled electrode for the light emitting device, the second thickness D2 is formed to be thicker than the first thickness D1, so that there is a technical effect of preventing destruction of the insulating properties of the third passivation layer 516 and damage to the first conductive layer 121*a* and the first clad layer 121*b*.

Meanwhile, according to internal research, if the top of the assembly barrier is lower than the top of the light emitting device being assembled, a problem may occur where the new semiconductor light emitting device collides with the assembled semiconductor light emitting device. Therefore, there is a need for technology to increase the height of the assembled partition.

The following will focus on the main features of the seventh embodiment.

Referring to FIG. 10, after the light emitting device is assembled in the first opening 117*a* of the second planarization layer, the third insulating layer 200 may be disposed on the second planarization layer 117. The third insulating layer 200 may be disposed so as not to overlap the first opening. Due to the arrangement of the third insulating layer 200, the insulating layer is formed thickly in areas other than the assembly hole area, and thus the generation of DEP force in areas other than the assembly hole area may be prevented.

Therefore, the DEP force is concentrated in the assembly hole, so the assembly force for the light emitting device may be improved.

In addition, the DEP force is small in areas other than the assembly hole, and the third insulating layer 200 blocks the path to the first opening 117*a*, making it difficult for a new light emitting device to access the assembly hole area.

Through this, there is a technical effect in that the risk of a new light emitting device colliding with an assembled light emitting device is reduced, and the assembled light emitting device may be protected by the third insulating layer 200.

Next, FIG. 11 is a cross-sectional view of the display device 1100 according to the eighth embodiment. The eighth embodiment may adopt the features of the second, third, sixth, and seventh embodiments.

For example, the eighth embodiment has a first thickness D1 of the third passivation layer 516 in the area within the first opening 117*a* and a thickness D2 of the third passivation layer 516 in the area other than the first opening 117*a*, the first thickness D1 is formed to be thinner than the second thickness D2 to strengthen the assembly force of the assembled electrode for the light emitting device, the second thickness D2 is formed to be thicker than the first thickness D1, there is a technical effect of preventing destruction of the insulating properties of the third passivation layer 516 and damage to the first conductive layer 121*a* and the first clad layer 121*b*. The description below will focus on the main features of the eighth embodiment.

Referring to FIG. 11, the first clad layer 1021*b* of the first assembly wiring 1021 may extend from the first conductive layer 1021*a* toward the second assembly wiring 1022. Additionally, the second clad layer 1022*b* of the second assembly wiring may extend from the second conductive layer 1022*a* toward the first assembly wiring 1021.

In the eighth embodiment, the first clad layer 1021*b* and the second clad layer 1022*b* are disposed with the third passivation layer 116 therebetween, so that they may overlap top and bottom.

Meanwhile, the second clad layer 1022*b* may be provided with a light emitting device (LED) and a predetermined electrode hole 1023 in an area overlapping with the first clad layer 1021*b*. The width of the electrode hole 1023 may be smaller than the width of the light emitting device (LED).

Additionally, an alternating current voltage may be applied to the first clad layer 1021*b* and the second clad layer 1022*b* to form an electric field.

The DEP force caused by this electric field may be concentrated in the electrode hole 1023 provided in the second clad layer 1022*b*.

The light emitting device (LED) may be self-assembled within the first opening 117*a* by concentrated dielectrophoretic force (DEP force).

There is a technical effect of strengthening the assembly force for the light emitting device (LED) due to the vertical overlap of the assembly wiring (1021, 1022). In addition, the first opening 117*a* does not vertically overlap the first conductive layer 1021*a* and the second conductive layer 1022*a*, which has the technical effect of reducing the thickness of the panel.

Meanwhile, the second clad layer 1022*b* may be disposed below the light emitting device (LED). Additionally, the second clad layer 1022*b* may be in contact with the first electrode 134 of the light emitting device (LED).

Therefore, as the second clad layer 1022*b* is disposed on the lower surface of the first electrode 134 of the light emitting device (LED), the light emitting devices (LEDs) are supported uniformly and have a wide electrical contact area between them, thereby improving carrier injection efficiency, resulting in a complex technical effect of improving luminous efficiency and brightness.

Next, FIG. 12 is a diagram showing the assembly wiring 1020 in detail in the display device 1100 of the eighth embodiment.

Referring to FIG. 12, in the eighth embodiment, a portion of the first clad layer 1021*b* and a portion of the second clad layer 1022*b* may overlap top and bottom. For example, the first clad layer 1021*b* may include a first-first clad layer 1021*b*1, a first-second clad layer 1021*b*2, and a first-third clad layer 1021*b*3. The first-second clad layer 1021*b*2 may be a protruding electrode extending from the first-first clad layer 1021*b*1 toward the second clad layer 1022*b*.

Additionally, the second clad layer 1022*b* may include a second-first clad layer 1022*b*1, a second-second clad layer 1022*b*2, and a second-third clad layer 1022*b*3. The second-second clad layer 1022*b*2 may be a protruding electrode extending from the second-first clad layer 1022*b*1 toward the first clad layer 1021*b*.

At this time, the first-second clad layer 1021*b*2 and the second-second clad layer 1022*b*2 may overlap vertically.

Additionally, the second-second clad layer 1022*b*2 may include an electrode hole 1023. Accordingly, DEP force may be concentrated and formed in the electrode hole 1023 of the second clad layer 1022*b*, and the Dep force is uniformly distributed in the assembly hole 1023, resulting in a technical effect of improving assembly force. Additionally, the second-third clad layer 1022*b*3 connecting the second-first clad layer 1022*b*1 and the second-second clad layer 1022*b*2 may be arranged to have an inclined surface. Through this, the second conductive layer 1022*a* is disposed in an area other than the first opening 117*a*, which has the technical effect of reducing the thickness of the panel.

A display device including a semiconductor light emitting device according to the above-described embodiment prevents the insulating properties of the insulating layer from being destroyed by increasing the thickness of the insulating layer disposed between the first assembly wiring and the second assembly wiring and has the technical effect of facilitating self-assembly of a light emitting device through a plurality of assembly wirings by reducing the thickness of the insulating layer disposed on the first assembly wiring.

Additionally, the embodiment has the technical effect of reducing corrosion and short circuit defects in a plurality of assembly wiring.

For example, corrosion and short circuit defects may be reduced by disposing an insulating layer on the step area of a plurality of assembly wiring. Additionally, corrosion of the conductive layer may be prevented by using a clad layer that is resistant to corrosion.

In addition, the embodiment has the technical effect of stably bonding a plurality of light emitting devices by reducing the step between the plurality of assembly wirings.

In addition, the embodiment has the technical effect of strengthening the assembly force of the light emitting device by arranging a plurality of assembly wirings in a vertically symmetrical structure.

In addition, the embodiment has the technical effect of solving the problem of tilting of the light emitting device by having one assembly wiring support the light emitting device.

In addition, the embodiment has the technical effect of improving assembly efficiency and protecting the assembled light emitting device by forming a thick insulating layer in areas other than the assembly hole.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF CITED REFERENCES

10: Motherboard AA: Display area NA: Non-display area SP: Sub-pixel
SPR: Red sub-pixel SPG: Green sub-pixel SPB: Blue sub-pixel
100, 500, 600, 700, 800, 900, 1000, 1100: Display device
110: Substrate 111: Buffer layer 112: Gate insulating layer 113: First passivation layer
114: first planarization layer 115: second passivation layer
116, 516, 616, 716, 816, 916: Third passivation layer
117: second planarization layer 200: third insulating layer 117*a*: first opening
117*b*: second opening 127*a*: third opening 118: third planarization layer 119: protective layer
120, 520, 620, 720, 920, 1020: Assembly wiring 121, 1021: First assembly wiring
121*a*, 1021*a*: first conductive layer 121*b*, 1021*b*: first clad layer
122, 522, 622, 722, 822, 1022: second assembly wiring
122*a*, 522*a*, 622*a*, 722*a*, 822*a*, 1022*a*: second conductive layer
122*b*, 522*b*, 622*b*, 722*b*, 822*b*, 1022*b*: second clad layer
1021*b*1: first-first clad layer 1021*b*2: first-second clad layer
1021*b*3: first-third clad layer 1022*b*1: second-first clad layer
1022*b*2: second-second clad layer 1022*b*3: second-third clad layer
1023: electrode hole 722*c*, 822*c*: third clad layer
127: Fourth planarization layer 127*a*: Third opening LED: Light emitting device
130: Red light emitting device 131: First semiconductor layer 132: Light emitting layer
133: second semiconductor layer 134: first electrode 135: second electrode
140: Green light emitting device 150: Blue light emitting device LS: Light blocking layer
SL: Scan wire DL: Data wire RL: Reference wire VDD: High potential power wire
VDD1: first layer VDD2: second layer VDD3: third layer TR1: first transistor
ACT1: first active layer GE1: first gate electrode SE1: first source electrode
DE1: first drain electrode TR2: second transistor ACT2: second active layer
GE2: second gate electrode SE2: second source electrode DE2: second drain electrode
TR3: Third transistor ACT3: Third active layer GE3: Third gate electrode
SE3: Third source electrode DE3: Third drain electrode SA: Step area
ST: storage capacitor ST1: first capacitor electrode ST2: second capacitor electrode
CE: connection electrode CE1: first connection layer CE2: second connection layer PE: pixel electrode
BM: Black Matrix CB: Chamber WT: Fluid MG: Magnet PL: Assembly wiring connections

INDUSTRIAL APPLICABILITY

The embodiment may be adopted in the field of displays that display images or information.

The embodiment may be adopted in the field of displays that display images or information using semiconductor light emitting devices.

The embodiment may be adopted in the field of displays that display images or information using micro- or nano-level semiconductor light emitting devices.

The invention claimed is:

1. A display device including a semiconductor light emitting device comprising:
- a substrate;
- a first assembly wiring and a second assembly wiring alternately arranged on the substrate and spaced apart from each other;
- a first insulating layer disposed between the first assembly wiring and the second assembly wiring;
- a planarization layer disposed on the first assembly wiring and the second assembly wiring and having a first opening; and
- a light emitting device disposed inside the first opening and having a first electrode configured to overlap the first assembly wiring and the second assembly wiring,
- wherein the first electrode is configured to be electrically connected to either the first assembly wiring or the second assembly wiring,
- wherein the first assembly wiring is configured to vertically overlap the second assembly wiring, and
- wherein the second assembly wiring comprises an electrode hole in an area configured to vertically overlap the first assembly wiring.

2. The display device including the semiconductor light emitting device according to claim 1, wherein a first thickness is a thickness of the first insulating layer in an area within the first opening,
- wherein a second thickness is a thickness of the first insulating layer in an area other than the first opening, and
- wherein the second thickness is thicker than the first thickness.

3. The display device including the semiconductor light emitting device according to claim 1, wherein the first assembly wiring comprises a first conductive layer disposed on the substrate and a first clad layer in contact with the first conductive layer,
- wherein the second assembly wiring includes a second conductive layer disposed on the first insulating layer and a second clad layer in contact with the second conductive layer, and
- wherein the first electrode is configured to be in contact with the second clad layer.

4. The display device including the semiconductor light emitting device according to claim 3, wherein the first conductive layer and the second conductive layer-is are configured to overlap the planarization layer, and
- wherein a portion of each of the first clad layer and the second clad layer is disposed inside the first opening.

5. The display device including the semiconductor light emitting device according to claim 4, wherein the second clad layer is configured to cover the first conductive layer on the first conductive layer.

6. The display device including the semiconductor light emitting device according to claim 4, further comprising a third clad layer disposed on a same plane as the first clad layer below the first insulating layer,
- wherein the third clad layer is configured to be connected to the second conductive layer through a contact hole included in the first insulating layer.

7. The display device including the semiconductor light emitting device according to claim 4, further comprising a second insulating layer configured to cover the first clad layer on the first clad layer.

8. The display device including the semiconductor light emitting device according to claim 1, further comprising a reflective layer disposed on a side of the planarization layer in the first opening.

9. The display device including the semiconductor light emitting device according to claim 1, further comprising a third insulating layer disposed on the planarization layer.

10. A display device including a semiconductor light emitting device comprising:

a substrate on which a plurality of sub-pixels are defined;

a first assembly wiring arranged along a plurality of sub-pixels arranged on a same wiring among the plurality of sub-pixels;

a second assembly lines wiring arranged along the plurality of sub-pixels arranged on the same wiring among the plurality of sub-pixels, and disposed adjacent to the first assembly wiring;

a planarization layer comprising a first opening configured to overlap the first assembly wiring and the second assembly wiring;

a first insulating layer configured to have a plurality of thicknesses on the first assembly wiring; and a light emitting device disposed in the first opening in each of the plurality of sub-pixels and electrically connected to the second assembly wiring, wherein the first assembly wiring is configured to vertically overlap the second assembly wiring, and wherein the second assembly wiring comprises an electrode hole in an area configured to vertically overlap the first assembly wiring.

11. The display device including the semiconductor light emitting device according to claim 10, wherein the first insulating layer comprises a first thickness in an area that is configured to overlap the first opening and a second thickness in an area that is not configured to overlap the first opening, and wherein the second thickness is thicker than the first thickness.

12. The display device including the semiconductor light emitting device according to claim 10, wherein the second assembly wiring is disposed on the first insulating layer.

13. The display device including the semiconductor light emitting device according to claim 10, wherein the first assembly wiring comprises a first conductive layer, and a first clad layer configured to be electrically connected to the first conductive layer, wherein the second assembly wiring comprises a second conductive layer; and a second clad layer configured to be electrically connected to the second conductive layer, wherein the first conductive layer and the first clad layer are made of different materials, and wherein the second conductive layer and the second clad layer are made of different materials.

14. The display device including the semiconductor light emitting device according to claim 13, wherein both the first clad layer and the second clad layer are configured to extend inside a second opening.

15. The display device including the semiconductor light emitting device according to claim 10, wherein a first conductive layer and a first clad layer comprise a step area due to a thickness of a first conductive layer, and wherein a second insulating layer is disposed on the first assembly wiring and overlaps the step area.

16. The display device including the semiconductor light emitting device according to claim 15, wherein the second insulating layer is disposed in the first opening.

17. The display device including the semiconductor light emitting device according to claim 15, wherein the second insulating layer is configured to overlap the first assembly wiring.

18. The display device including the semiconductor light emitting device according to claim 15, further comprising a third insulating layer disposed on the planarization layer.

* * * * *